United States Patent
Hopkins et al.

(10) Patent No.: US 6,366,208 B1
(45) Date of Patent: Apr. 2, 2002

(54) DIAGNOSTIC FUNCTIONS FOR POWER SUPPLY

(76) Inventors: William Thomas Hopkins, 105 Maplewood Dr.; David Henrik Riesland, 101 Old Columbia Rd.; Anthony William Banks, 108 Payne Springs Rd., all of Dickson, TN (US) 37055

( * ) Notice: Subject to any disclaimer, the term of this patent is extended or adjusted under 35 U.S.C. 154(b) by 0 days.

(21) Appl. No.: 09/453,426

(22) Filed: Dec. 2, 1999

Related U.S. Application Data

(62) Division of application No. 09/063,475, filed on Apr. 20, 1998, now Pat. No. 6,040,778.

(51) Int. Cl.[7] .............................................. G08B 21/00
(52) U.S. Cl. ...................... 340/650; 340/649; 340/664; 324/509; 315/129; 361/42
(58) Field of Search ................. 340/635, 550, 340/310.81, 649, 664; 361/42; 324/509; 315/129

(56) References Cited

U.S. PATENT DOCUMENTS

| | | | |
|---|---|---|---|
| 4,016,489 A | 4/1977 | Adams et al. | 324/51 |
| 4,507,698 A | 3/1985 | Nilssen | 361/42 |
| 4,563,719 A | 1/1986 | Nilssen | 361/45 |
| 4,613,934 A | 9/1986 | Pacholok | 363/131 |
| 4,663,571 A | 5/1987 | Nilssen | 315/244 |
| 4,675,576 A | 6/1987 | Nilssen | 315/242 |
| 4,855,860 A | 8/1989 | Nilssen | 361/45 |
| 4,939,427 A | 7/1990 | Nilssen | 315/209 R |
| 5,049,787 A | 9/1991 | Nilssen | 315/209 R |
| 5,089,752 A | 2/1992 | Pacholok | 315/307 |
| 5,241,443 A | 8/1993 | Efantis | 361/36 |
| 5,349,273 A | 9/1994 | Pacholok | 315/307 |
| 5,457,360 A | 10/1995 | Notohamiprodjo et al. | 315/219 |
| 5,515,218 A | 5/1996 | DeHaven | 361/45 |
| 5,550,437 A | 8/1996 | Hopkins et al. | 315/209 R |
| 5,751,523 A | 5/1998 | Ballard et al. | 361/42 |
| 6,040,778 A | * 3/2000 | Hopkins et al. | 340/650 |
| 6,114,947 A | * 10/2000 | Tondorf | 340/310.01 |

FOREIGN PATENT DOCUMENTS

EP 0 615 402 A2 4/1994 ............ H05B/41/29

OTHER PUBLICATIONS

Efantis, Tony, *Ground–Fault Protection on Neon Secondaries*, Signs of the Times, Jul. 1996, pp. 130–133, 188.

* cited by examiner

*Primary Examiner*—Edward Lefkowitz

(57) ABSTRACT

A power supply circuit detects ground fault paths, and miswiring of the load, using a test mode in which electrical power is applied to only one power output terminal of the power supply relative to the ground terminal, while substantially no electrical power is applied to the second power output terminal relative to the ground terminal. If application of power during the test mode causes substantial current flow through ground, then there is a ground fault path, or an incorrect connection between the midpoint of the load and ground. The power supply further includes unique features for signaling the presence and kind of fault it has detected; the power supply is capable of distinguishing between ground faults in at least two different locations, and when a fault is detected, the power supply signals the presence of the fault and its location, e.g., by timed blinking of the connected discharge light. These features are enhanced by a diagnostic analyzer for connection to the power supply. The diagnostic analyzer monitors power flow from the output terminals of the diagnostic analyzer to the input terminals of the power supply, and evaluates the power flow to identify power flow patterns indicative of a fault and the kind of fault. The power supply also reduces inrush current by disconnecting and reconnecting power to the transformer primary winding in opposite half-cycles of the alternating current electrical power.

8 Claims, 18 Drawing Sheets

DIAGNOSTIC FUNCTIONS FOR POWER SUPPLY

CROSS-REFERENCE TO RELATED APPLICATION

This application is a divisional of application Ser. No. 09/063,475, filed on Apr. 20, 1998, now U.S. Pat. No. 6,040,778.

This application is related to previously-filed, copending U.S. patent application Ser. No. 08/838,060, filed Apr. 17, 1997, entitled "SAFETY-ENHANCED TRANSFORMER CIRCUIT", which is assigned to the same assignee as the present application, and is incorporated by reference herein in its entirety.

FIELD OF THE INVENTION

The present invention relates to gas discharge tubing power supplies and the like.

BACKGROUND OF THE INVENTION

Power supplies are typically used in powering gas discharge lighting, to convert a low impedance, low voltage power source, such as a 120 Volt 60 Hz AC wall outlet, into a higher voltage source suitable for connection transformer is used to step up the voltage of the 120 Volt AC source. The 120 Volt AC source is connected to the primary winding of the transformer and the secondary winding of the transformer is connected to the gas discharge lamp.

A neon sign (hereinafter also called "neon tubing"), is one example of a gas discharge lamp. Neon signs typically use a transformer (hereinafter also called a "neon transformer") to illuminate the sign. The following discussion of the background and the invention will refer to power supply circuits used for neon signs, however, it will be understood that principles of the present invention have application to power supply circuits for other gas discharge tube lamps as well.

A primary concern with known neon power supplies, is the potential that a ground fault from the high voltage outputs of the power supply can create substantial current flows, potentially causing fires if the ground fault creates an arc involving flammable materials. A potentially dangerous ground fault current may occur anytime there is a relatively low impedance path from one of the high voltage output leads of the neon power supply to ground. Such a path may be formed if a neon sign is carelessly installed so that one of the output leads connected to the sign is in contact with a low impedance in a window frame, doorway, or other ground-connected relatively low impedance.

To detect ground fault current, it is typically necessary to couple a ground fault detection circuit to the secondary winding of the power supply transformer, and/or to the neon sign itself. Specifically, the ground fault detection circuit may be coupled between a path to ground, and either a center tap of the secondary winding of the transformer, and/or a return point located near the electrical mid-point of the neon tubing. If there is a secondary ground fault, the transformer circuit automatically interrupts power.

Troubleshooting a neon sign for ground faults is difficult, because ground faults are not always visibly detectable. Often, it is necessary to carefully measure currents flowing through various connections to determine the location of the fault, which can be an arduous process. If difficulty in locating a fault may tempt the installer to conclude that the secondary ground fault interruption circuitry is malfunctioning, and try to defeat the ground fault circuitry.

Thus, there is a need for circuitry which enables a gas discharge tubing installer to identify and pinpoint the location of a ground fault quickly and accurately, to speed installation and minimize the temptation for tampering with the ground fault detection circuitry.

The circuitry described in the above referenced U.S. patent application Ser. No. 08/838,060 includes several features for preventing the ground fault detection circuitry from being inadvertently or deliberately defeated. A difficulty with this and other known secondary ground fault interrupting circuits, is that none can reliably detect a ground fault reliably when the center of the gas tube load is connected to earth ground. This is due to cancellation of the opposite and nearly equal currents entering the ground node. The net resulting current into/out of ground may not be sufficient to activate a secondary ground fault detection circuit connected between a midpoint of the transformer secondary and ground. Thus, the ground fault detection features of these circuits can often be defeated by grounding the mid-point of the load.

For example, FIG. 1 illustrates a neon transformer circuit 10 with a secondary ground fault interrupter, such as that described in the above-referenced U.S. patent application Ser. No. 08/838,060, connected to a load which is grounded at its mid-point. The neon transformer includes a primary winding 12 and secondary windings 14 and 16. The leads of primary winding 12 are connected to 120 Volt AC power via switch 13, causing secondary windings 14 and 16 to develop substantially higher voltages for driving the load. Secondary windings 14 and 16 are drawn as two windings connected in series at a common node 17, but could also be a single secondary winding with a center tap. The center tap or common node 17 of the secondary windings is connected through a ground fault current detection circuit 18 to a path to ground. If detection circuit 18 senses any substantial current flow between node 17 and ground, circuit 18 generates a SHUT DOWN signal on line 20, causing switch 13 to open and remove power from the transformer circuit.

As noted above, a secondary ground fault detector of this kind can be defeated by connecting a mid-point of the load to ground. As seen in FIG. 1, the load connected to secondary windings 14 and 16 includes two series-connected loads 22 and 24, as well as a ground fault path 26 from secondary 14 to ground.

Typically, the neon transformer is a leakage reactance type transformer which exhibits a relatively constant current over a wide range of load impedances. Furthermore secondary windings 14 and 16 are typically virtually identical and therefore produce similar load currents that are opposing (180 degrees out of phase).

Under these conditions, note that the current flowing out of secondary 14 divides and flows into two separate paths. Some current flows through load 22 into ground while the remainder flows through the ground fault path 26 into ground. The current then recombines and flows through ground, through the ground fault current detector 18 and back to secondary 14. The current from secondary 16 flows through the ground fault current detector 18 into ground, through load 24, and back to secondary 16. The current from secondary 16 that flows through the ground fault current detector 18 is similar in magnitude but opposite in direction to the current flowing from secondary 14. This results in little or no net current flow through the ground fault current detector 18, which may not activate despite the presence of a fault current through the fault path 26 which is sufficient to start a fire.

Accordingly, there is a need for a transformer circuit with secondary ground fault detection which cannot be defeated by shorting a mid-point of the load to ground.

An additional common difficulty with transformer circuits is momentary inrush current experienced when power is initially applied. This inrush current can be twenty times greater than the normal steady state operating current, and last ten to twenty AC cycles before normal steady state operating conditions are achieved. This large current can cause nuisance tripping of circuit breakers, and lead to premature fuse or circuit breaker failures. Line voltage sags resulting from high inrush currents can also interfere with other electronic equipment connected to the AC line.

Properly designed transformers, when connected to standard 120 Volt AC power, will achieve a steady state in which the magnetic field intensity and flux density vary with the line voltage within the linear region of the B-H curve of the core, with relatively low loss and low current. When power is removed, this variation will cease. However, if power is suddenly disconnected when the magnetic flux density in the core is near its peak value, a residual amount of magnetic flux density will remain in the core. The core will retain this residual magnetic flux until power is reapplied. The residual magnetic flux is not in itself harmful; however, when power is reapplied, if the initial half-cycle of the applied line voltage generates magnetic flux in the same direction as the residual flux in the core, at the first peak of the applied line voltage, the magnetic flux density in the core will substantially exceed the steady state peak flux density. This can drive the magnetic core of the transformer into the nonlinear (saturated) region of its B-H curve, where the primary inductance of the transformer decreases radically. At this point a very large inrush current will be drawn by the transformer. With successive cycles of the applied line voltage, for as long as ten to twenty cycles, the magnetic core will continue to be driven in one direction into the nonlinear region of the B-H curve of the core, with the extent of the excursion slowly decreasing until steady state operation is achieved. During these ten to twenty cycles, decreasing levels of inrush current will be drawn corresponding to each peak of the applied line voltage, leading to the problems identified above.

Thus, there is a need for a transformer circuit which exhibits reduced inrush currents when power is initially applied.

SUMMARY OF THE INVENTION

In accordance with principles of the present invention, the needs described above are met by a power supply circuit incorporating unique fault detection and inrush current prevention features, as well as a diagnostic analyzer for use with a power supply for diagnosing faults.

In accordance with a first aspect of the present invention, the power supply circuit detects ground fault paths, and miswiring of the load, using a test mode in which electrical power is applied to only one power output terminal of the power supply relative to the ground terminal, while substantially no electrical power is applied to the second power output terminal relative to the ground terminal. The power supply includes a ground fault detection circuit connected to a path to ground. If application of power during the test mode causes substantial current flow through the ground path, then there is a ground fault path, or an incorrect connection between the midpoint of the load and ground. An electrical signal of this condition is produced which can be used to notify the operator and/or disable the power supply.

In the specific embodiment disclosed below, the power supply includes a transformer having a primary and a secondary winding, the primary winding being connectable to a source of alternating current electrical power, the first power output terminal of the power supply being connected to a first end of the secondary winding, and the second power output terminal being connected via an electrical switch to a second end of the secondary winding, and a center tap of the secondary winding being connected via the ground fault detection circuit to the path to ground. In this embodiment, in the test mode the switch is opened to disconnect the second end of the secondary winding from the second output terminal.

In an alternative embodiment, the power supply includes first and second transformers respectively having first and second primary windings and first and second secondary windings, the primary windings being connectable to a source of alternating current electrical power, the first power output terminal being connected to a first end of the first secondary winding, the second end of the first secondary winding being connected to a first end of the second secondary winding and the ground fault detection circuit, a second end of the second secondary winding being connected to the second power output terminal.

In this embodiment, in the test mode only the first primary winding is connected to alternating current electrical power, so as to energize only the first secondary winding and first power output terminal. To perform additional testing, only the second primary winding may be connected to alternating current electrical power, so as to energize only the second secondary winding and second power output terminal.

In another alternative embodiment, the power supply may include a clamp winding magnetically coupled to the second secondary winding. In this embodiment, in the test mode the ends of the clamp winding can be shorted together, preventing any substantial energization of the second secondary winding or second power output terminal.

In any of these embodiments, when the ground fault detection circuit detects a fault, the power supply may generate a visual indication of the fault. For example, the power supply may include a light emitting diode which is illuminated when there is a ground fault. Alternatively, the power supply may repeatedly apply and remove electrical power from one or both of the power output terminals to cause the gas discharge load to visually indicate a fault.

In another aspect, the power supply includes unique features for signaling the presence and kind of fault it has detected. The power supply includes a ground fault detection circuit for detecting a ground fault between the load and ground. The power supply is capable of distinguishing between ground faults in at least two different locations, and when a fault is detected, the power supply signals the presence of the fault and its location.

In specific embodiments, the power supply generates a visual indication of the presence and location of the ground fault, for example, by repeatedly applying and removing electrical power from one or both of the power terminals, and/or by illuminating a light emitting diode, and/or by generating an audible signals such as a synthesized human voice. In the specific embodiment disclosed below, a diagnostic analyzer having light emitting diodes and a voice synthesizer, is connected temporarily to a transformer circuit, to form a power supply able to use the light emitting diode and an audible signal to identify the location of a fault. However, in other embodiments, these functions of the diagnostic analyzer may be incorporated into the transformer circuit and thus permanently installed with the transformer circuit.

Another aspect of the invention relates to a diagnostic analyzer for connection to a power supply and diagnosing the presence of a fault. The diagnostic analyzer monitors power flow from the output terminals of the diagnostic analyzer to the input terminals of the power supply, and evaluates the power flow to identify power flow patterns indicative of a fault. When a fault is recognized, the diagnostic analyzer signals the presence of the fault.

In specific embodiments, the diagnostic analyzer circuit generates a visual indication of a fault, e.g., by illuminating a light emitting diode. In addition, the diagnostic analyzer generates a audible signal indicating the fault, e.g., in a synthesized human voice.

The diagnostic analyzer is also used to activate a test mode of the power supply by applying a command signal to the input power terminals of the power supply. For example, the diagnostic circuit rapidly connects and disconnects power to the power supply, to signal the power supply to enter its test mode. Furthermore, the power supply may include circuitry for generating particular power flow patterns to identify a kind of fault, in which case the diagnostic analyzer may recognize the kind of fault from its characteristic power flow pattern.

In another aspect, the invention features a power supply for reducing inrush current incident to application of alternating current electrical power to a primary winding of a transformer. The power supply monitors cycles of alternating current electrical power applied to its power input terminals, and identifies opposite half-cycles of the alternating current electrical power. Using this information, the power supply disconnects and reconnects power to the transformer primary winding in opposite half-cycles of the alternating current electrical power. As a result, residual magnetization in a core of the transformer left upon disconnection of the power input and power output terminals, opposes induced magnetization of the core upon reconnection of the power input and power output terminals, reducing inrush current.

In the specific embodiment described below, the power supply only disconnects power from the primary winding during a predetermined half-cycle, and only connects power to the primary winding during the half cycle opposite to the predetermined half cycle.

In further aspects, the invention features the methods carried out by a power supply and diagnostic analyzer in accordance with the invention, in detecting miswiring and faults, and reducing inrush currents.

The above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

Figure 1:
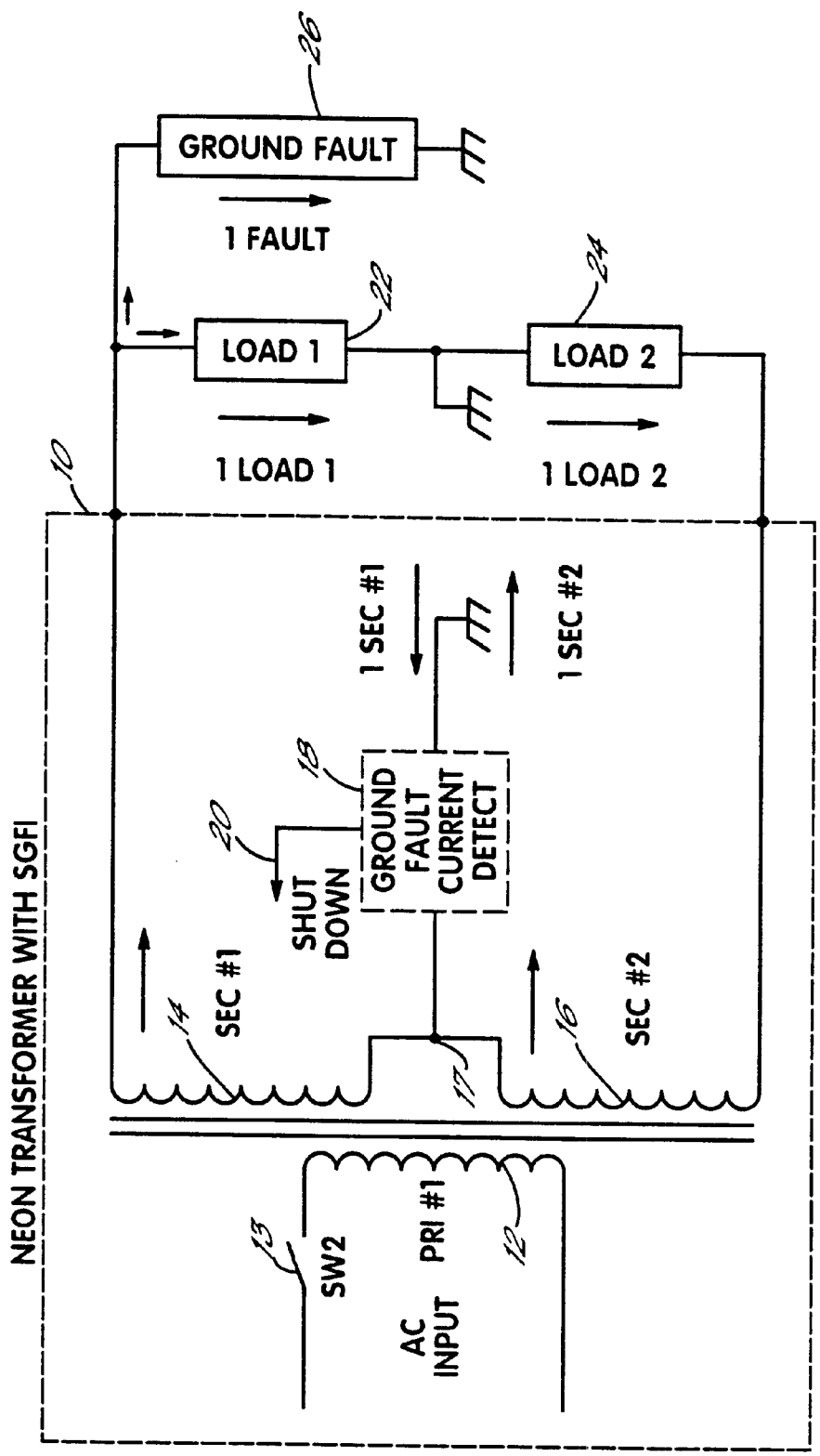
FIG. 1 is a block diagram of a typical secondary ground fault detecting transformer circuit connected to a grounded midpoint load with a ground fault path.
Figure 2:
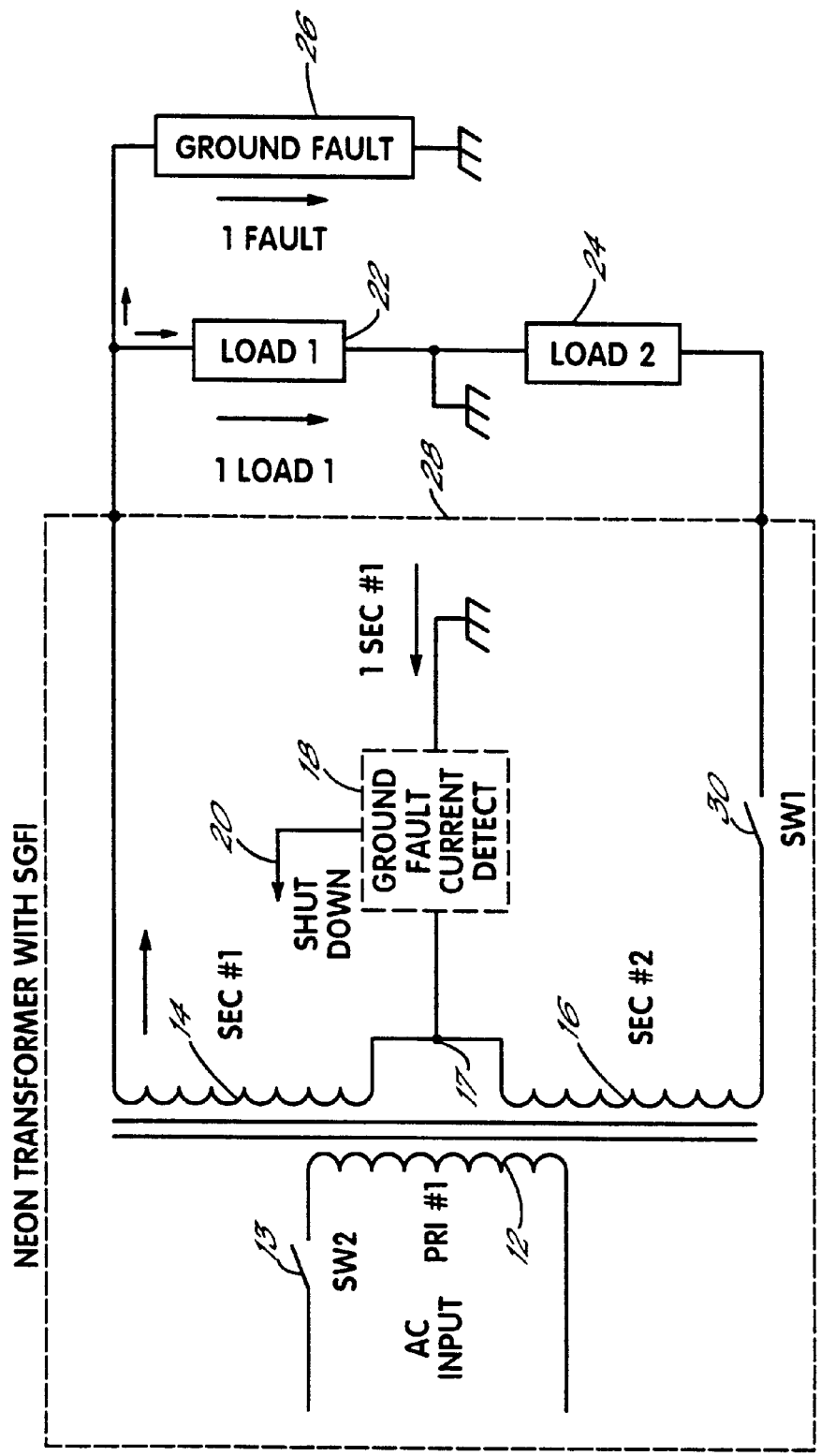
FIG. 2 is a block diagram a secondary ground fault detecting transformer circuit in accordance with principles of the present invention, connected to a grounded midpoint load with a ground fault path.

FIG. 2 generally illustrates a neon transformer circuit 28 in accordance with principles of the present invention, in which switch 30 has been added to the typical neon transformer circuit illustrated in FIG. 1, in series with the output lead from secondary 16. Switch 30 permits independent control of the application of electrical power from secondaries 14 and 16. Initially switch 30 is open which prevents load 24 from being energized by secondary 16, and no significant current will flow in secondary 16 or load 24, nor will secondary 16 current flow through the ground fault current detect circuit 18. However, secondary 14 remains connected to load 22 and the voltage across secondary 14 will cause current to flow in load 22 and the ground fault path 26. The current from secondary 14 will divide with some of the current flowing into load 22, and the remainder of the current flowing through the ground fault path 26. These two currents will recombine when the ground node is reached, and flow through ground into the ground fault current detect circuit 18 and back to secondary 14. Note that essentially all secondary 14 current flows through the ground fault current detect circuit 18, unmasked by opposing current from secondary 16 flowing through load 24. This activates the ground fault current detect circuit 18, which generates a SHUT DOWN signal on line 20. This SHUT DOWN signal on line 20 can then be used to trigger primary control circuitry to remove primary power from the transformer. If, however, the current through the ground fault current detect circuit 18 is less than the predetermined threshold established by the ground fault current detect circuit, no shut down will occur. In this situation, switch 30 can be closed, allowing normal operation of the sign.

Figure 3:
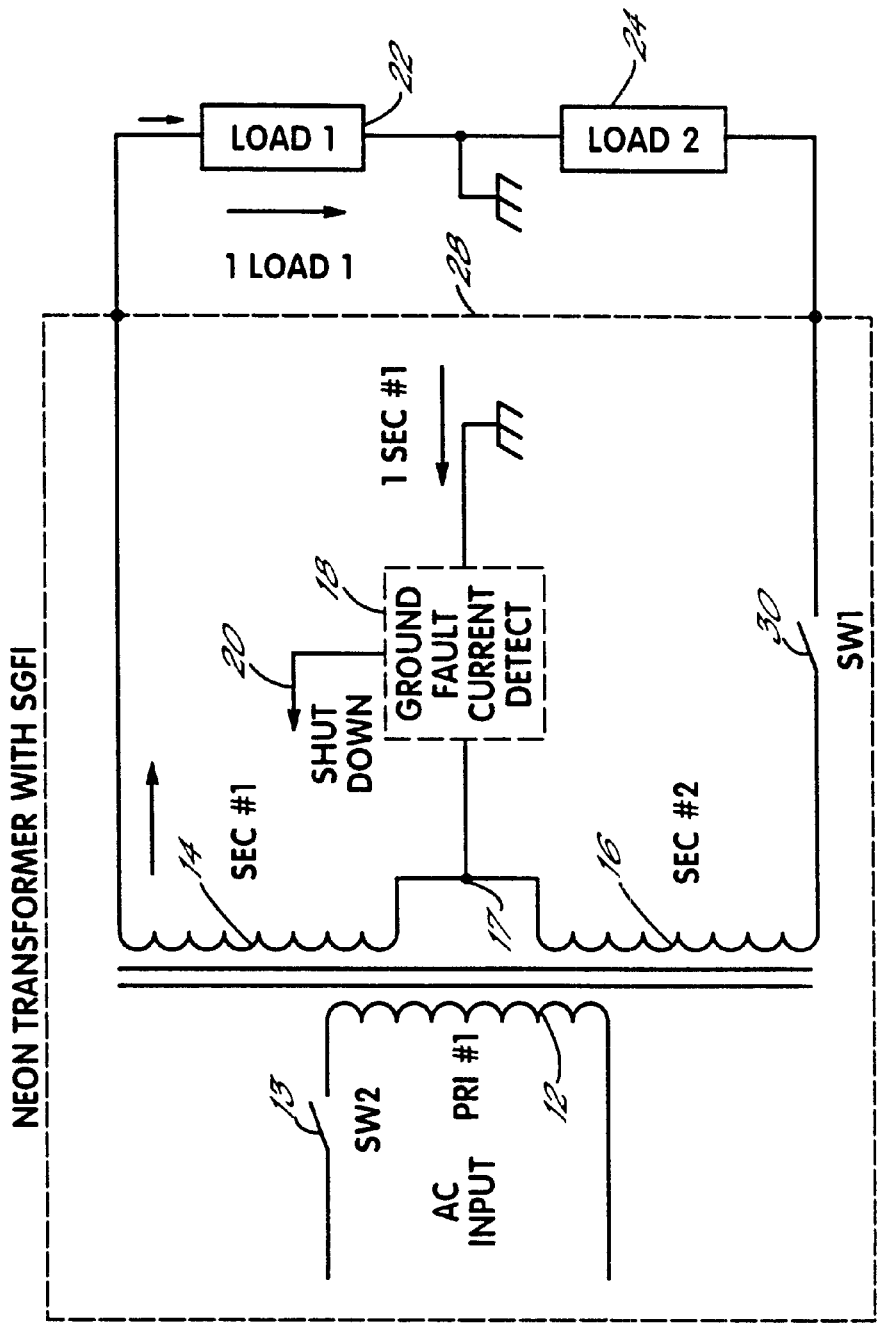
FIG. 3 is a block diagram of the circuit of FIG. 2 connected to a grounded midpoint load without a ground fault path.

It should be further noted that the ground fault interrupter circuit 18 will be activated when switch 30 is open, if the midpoint of the load is grounded, even if there is no ground fault path 26. FIG. 3 shows an installation that does not have a ground fault path, but in which the midpoint of the load between loads 22 and 24, is grounded. Here, due to the midpoint ground in the load, essentially all of the secondary 14 current flows through load 22, through the midpoint ground, from ground and through the ground fault detect circuit 18, without being masked by opposing current flows from secondary 16. This causes the SHUT DOWN signal to be generated, allowing service personnel to recognize the ground fault and correct the problem before leaving the site.

The embodiments of the invention discussed above include a switch 30 in series with an output lead, which when open prevents the energization of one output lead. This is only one method of achieving satisfactory results. Several other methods may be used to cause only one output lead to be energized.

Figure 4:
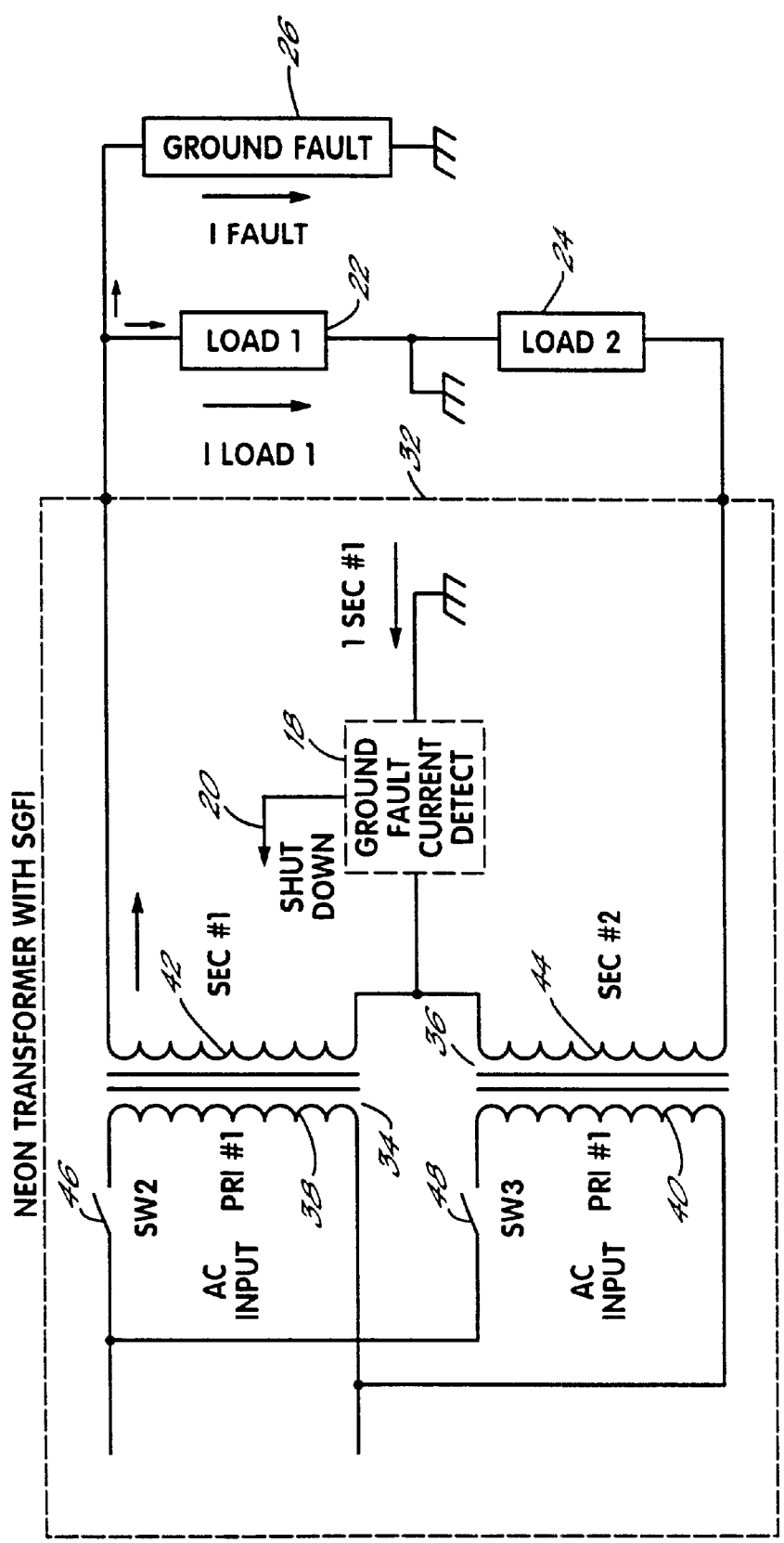
FIG. 4 is a block diagram of an alternative embodiment of a secondary ground fault detecting transformer circuit in accordance with principles of the present invention, illustrating detection of a grounded midpoint load.

FIG. 4 illustrates a transformer circuit 32 having two transformer cores 34 and 36 with respective primary windings 38 and 40 and secondary windings 42 and 44. The secondary windings 42 and 44 are connected together in series to form what is in effect a single secondary winding with a center tap. The ground fault current detect circuit 18 is connected between the connected terminals of the secondary windings 42 and 44 and a path to ground.

Primary windings 38 and 40 are connected to a source of AC electrical power through series connected switches 46 and 48, which may be solid state, or electromechanical type switches such as relays. Switches 46 and 48 may be sequenced on manually or automatically. There are no switches in series with the secondary windings 42 and 44.

In use of this embodiment, only switch 46 is turned on, energizing primary 38 and secondary 42. Current from secondary 42 will flow into load 22 and/or the ground fault path 26. As previously described, the current in load 22 and the current in the ground fault path 26 flow into the ground node, through the ground fault detect circuit 18 and back to secondary 42. During this period, switch 48 remains open, so that primary 40 and secondary 44 are inactive, and substantially no current flows in load 24, nor does any current flow from secondary 44 into the ground fault detect circuit 18. The secondary 42 current flowing through the ground fault detect circuit 18 is unopposed by any significant current flow from secondary 44, causing ground fault detect circuit 18 to generate a SHUT DOWN signal indicating the presence of a ground fault.

Figure 5:
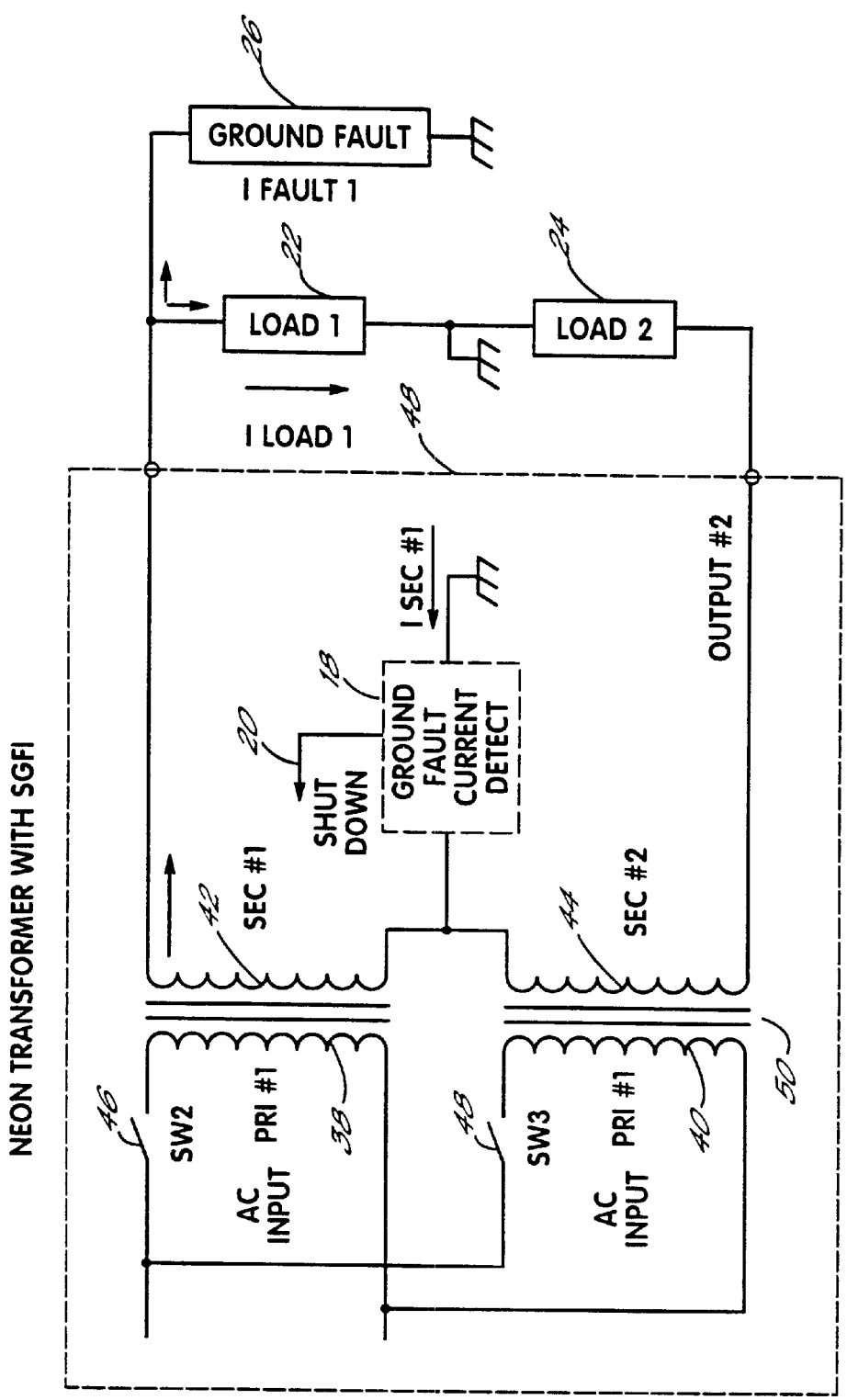
FIG. 5 is a block diagram of a second alternative embodiment of a secondary ground fault detecting transformer circuit in accordance with principles of the present invention, connected to a grounded midpoint load with a fault path.

In the embodiment of FIG. 5, a transformer circuit 48 includes a single transformer core 50, which replaces the two transformers illustrated in FIG. 4. This single transformer core has two primary windings 38 and 40 and two secondary windings 42 and 44 on a single core structure. The positions of the windings on the core is such that the magnetic coupling between primary winding 38 and secondary winding 42 is substantially stronger than the coupling of either of windings 38 and 42 to either of windings 40 and 44. Similarly, the magnetic coupling between primary winding 40 and secondary winding 44 is substantially stronger than the coupling of either of windings 40 and 44 to either of windings 38 and 42. This transformer structure is more economical than using two individual transformers, yet provides the same ability to energize one secondary output lead at a time. Specifically, when AC electrical power is applied only to primary winding 40, substantially only secondary winding 42 is energized, such that a ground fault path 26 and or the presence of a grounded midpoint in the load can be detected in the same manner as described above in connection with the embodiment of FIG. 4.

Figure 6:
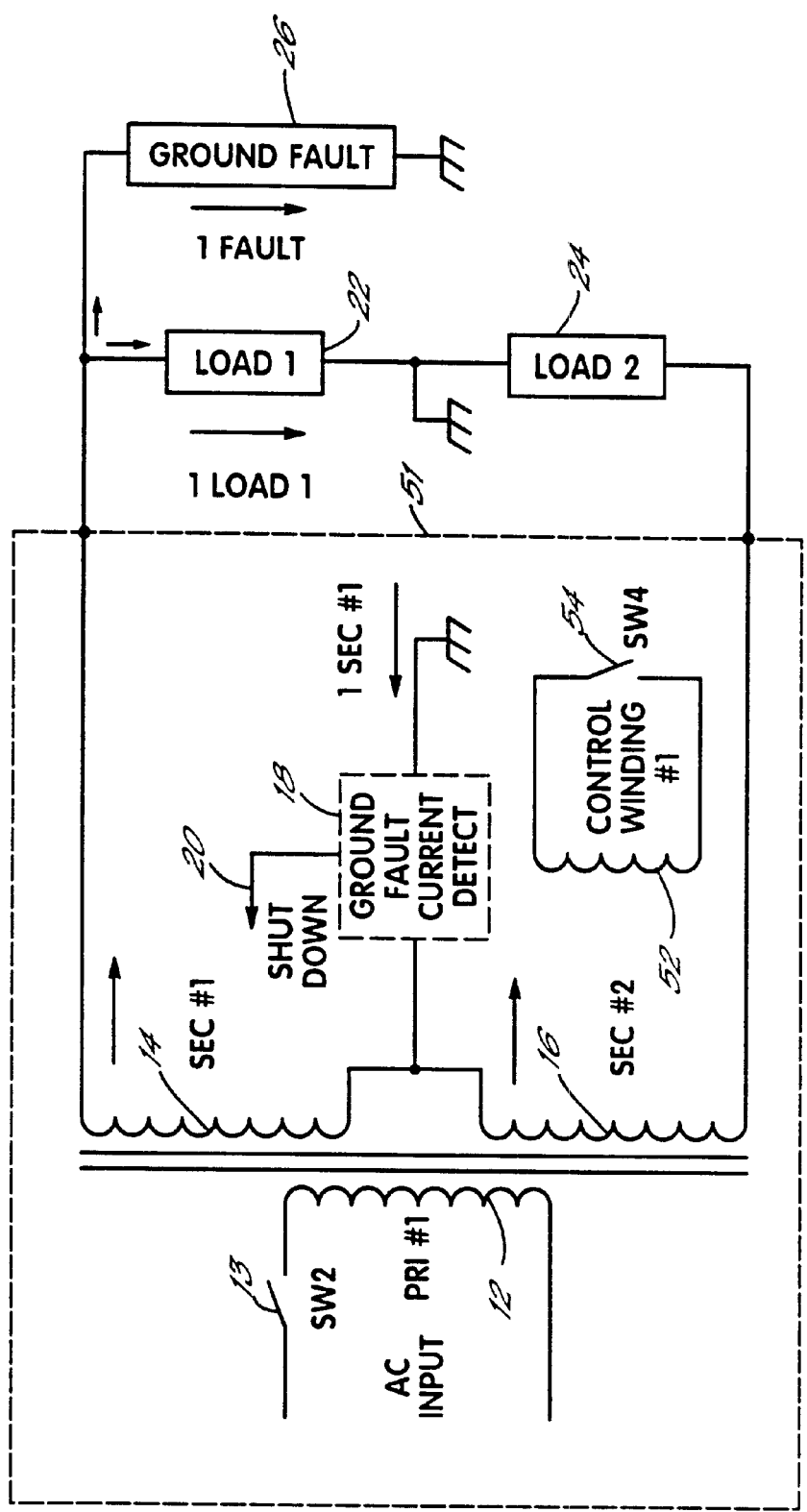
FIG. 6 is a block diagram of a third alternative embodiment of a secondary ground fault detecting transformer circuit in accordance with principles of the present invention, connected to a grounded midpoint load with a fault path.

FIG. 6 shows another alternative embodiment of a transformer circuit 52 capable of energizing only one secondary output lead. Circuit 52 is similar to the circuit 28 shown in FIG. 1, in that it includes a transformer with a single primary winding 12 and two secondary windings 14 and 16. In addition, however, the transformer has a clamp winding 52, the ends of which can be connected together through a switch 54. Clamp winding 52 is tightly magnetically coupled to secondary winding 16, but substantially less magnetically coupled to secondary winding 14 and primary winding 12. Further details on the use of clamp windings can be found in U.S. Pat. No. 5,550,437, which is hereby incorporated herein by reference. FIG. 3 of that patent shows a magnetic core with three legs. A core of this kind could be used to form the transformer in the transformer circuit 52 of FIG. 6, with the primary winding on the central leg and secondary windings 14 and 16 on the outer legs. When switch 54 is closed the control winding 52 is effectively shorted and the voltage across the control winding 52 is near 0 volts. The current in the control winding 52 is limited by the leakage reactance between the primary winding 12 and control winding 52. Secondary winding 16 is tightly coupled to the control winding 52 so the output voltage of secondary winding 16 must also be low, to the extent that no significant current flows in the load 24. However, secondary 24 is energized fully since it is not magnetically coupled to clamp winding 52. Accordingly, if the midpoint of the load is grounded, or there is a ground fault path 26, ground fault current detect circuit 18 will detect the secondary 14 current flowing, and generate a SHUT DOWN signal on line 20. If the midpoint of the load is not grounded, and there is no fault path 26 to ground, then no substantial current will flow through secondary 14 and ground fault current detect circuit 18, and the SHUT DOWN signal on line 20 will not be generated.

Figure 7:
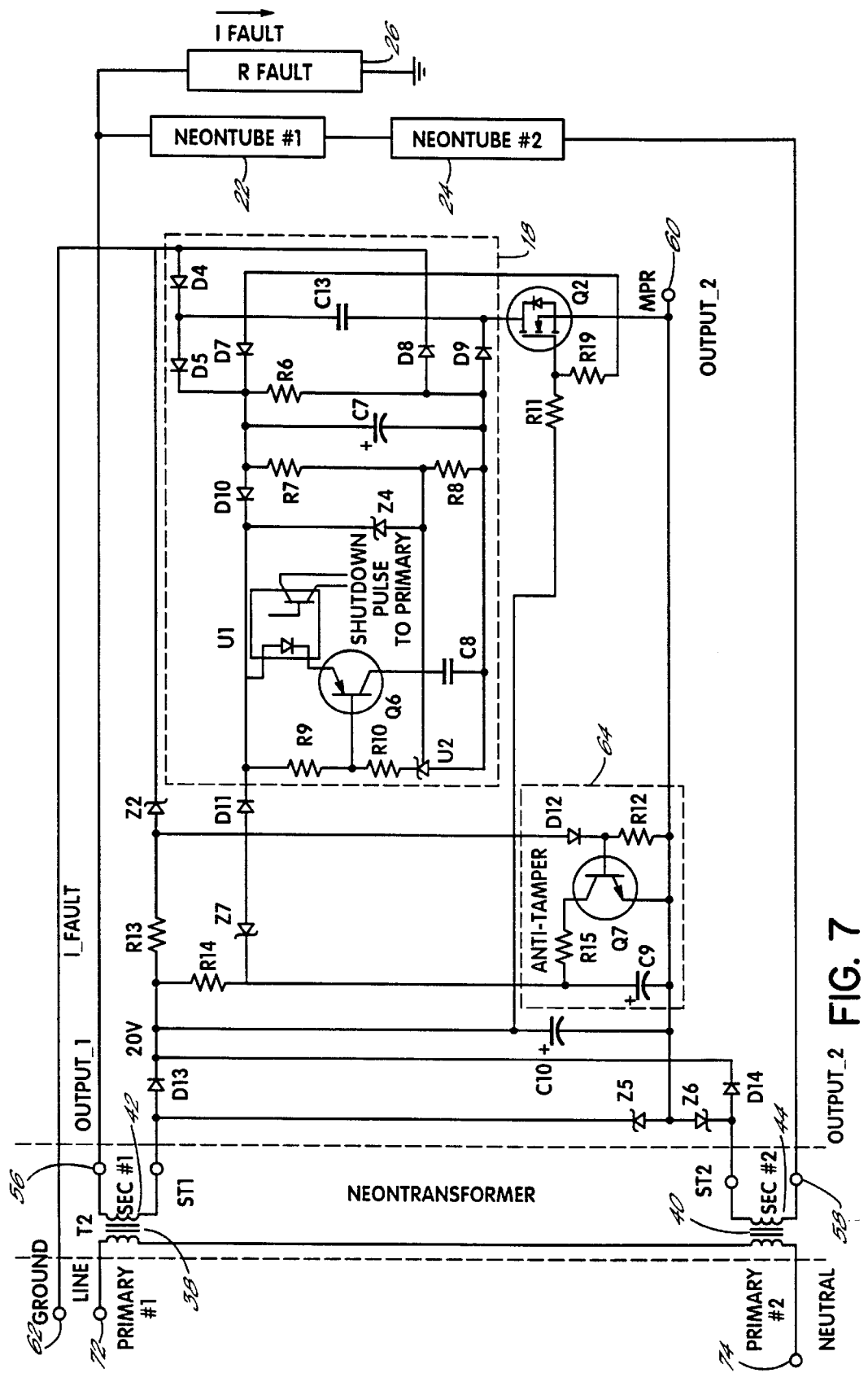
FIG. 7 is a diagram of secondary circuitry corresponding to the block diagrams of FIGS. 4 and 5, coupled to secondary windings of a transformer for detecting ground fault currents, and connected to a load with a ground fault path.

FIG. 7 illustrates a specific circuit implementation of a ground fault current detect circuit 18 generating a SHUT DOWN signal, and surrounding circuitry used in a transformer circuit such as shown in FIG. 5. This circuit is substantially similar to the corresponding circuitry that is described in detail in the above-referenced U.S. patent application Ser. No. 08/838,060.

As discussed in greater detail in connection with FIG. 3 of application Ser. No. 08/838,060, the circuitry connected to the secondary windings requires a source of bias power to provide a SHUT DOWN signal to the primary. This is achieved by placing an impedance, zener diodes Z5 and Z6, in series with secondaries 42 and 44 respectively where the secondaries would normally connect to the midpoint return terminal. On the positive half cycle, secondary current flows from secondary 42, through rectifier D13, through capacitor C10, and through zener diode Z6 (anode to cathode). On the negative half cycle secondary current flows from secondary 44, through rectifier D14, through capacitor C10, and through zener diode Z5 (anode to cathode). Capacitor C10 thus accumulates charge which increases the voltage across capacitor C10. When the voltage across capacitor C10 is charged sufficiently, zener diodes Z5 & Z6 conduct, limiting the voltage on capacitor C10. Thus a bias voltage source is developed across capacitor C10 to power secondary referenced circuitry.

FIG. 7 also shows the tubing load including loads 22 and 24, and a ground fault path 26. Secondary ground fault current flowing from secondary 42 flows from output terminal 56, through path 26 into ground, to the chassis ground terminal 62. The chassis ground terminal connects through ground fault detect circuit 18 to transistor Q2, permitting ground fault current to flow to the midpoint return terminal 60, through zener diode Z5 anode to cathode, to secondary 42. Inside of the ground fault detect circuit 18, the alternating ground fault current is rectified by diodes D4, D5, D7, D8, & D9, and filtered by capacitor C7. The rectified current then flows through resistor R6 which develops a voltage proportional to the fault current. Resistors R7 and R8 sample and divide this DC voltage which is applied to shunt regulator U2, and compared to a reference internal to shunt regulator U2. When excessive fault current flows this voltage is sufficient to turn on shunt regulator U2, and current flows from capacitor C7, through diode D10, through the light emitting diode in optical isolator U1, through transistor Q6 (emitter to base), through R10, through U2 into the midpoint return terminal and through zener Z5 to secondary 42. The current through the base of transistor Q6 turns on transistor Q6, allowing current to flow out of the collector of transistor Q6 into R8 and C8, which further raises the reference terminal of regulator U2. Regulator U2 and transistor Q6 thus drive each other into a latched conducting state. The current flowing in the isolator U1 light emitting diode turns on its photo transistor which produces a SHUT DOWN signal connected to the primary portion of the transformer circuit. The conducting photo transistor of isolator U1 causes the primary circuit to shut down the neon transformer, preventing operation when an excessive ground fault load is present. In this manner the sign installation is protected from secondary ground faults that could cause a fire.

Figure 8:
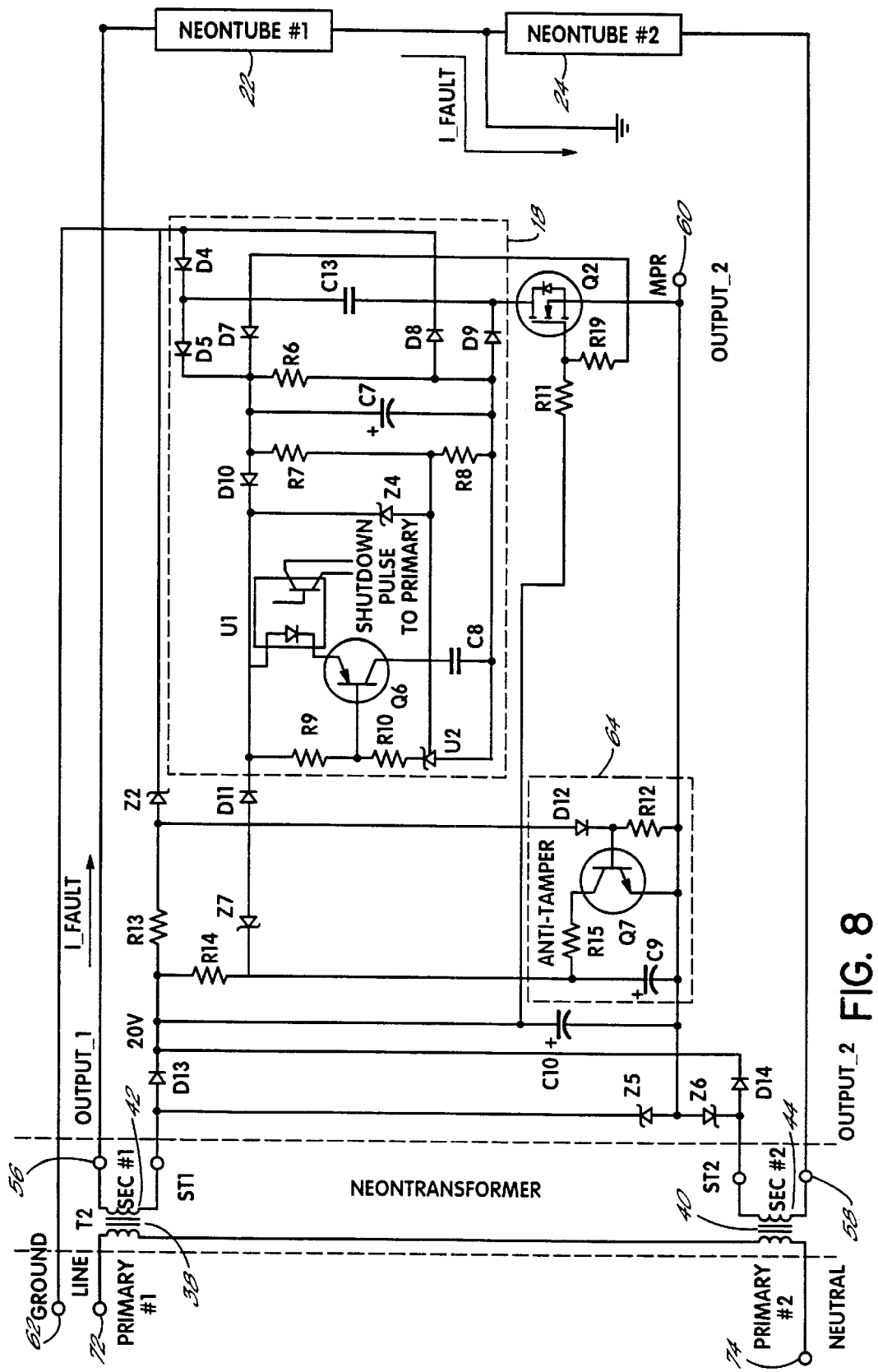
FIG. 8 is a diagram of the secondary circuitry of FIG. 7, connected to a load with a grounded midpoint.

FIG. 8 illustrates another condition detected by the ground fault detect circuit 18—an improper connection from the middle of the tubing load to ground that could allow a ground fault to go undetected by other circuits. As previously discussed, secondary 42 is energized for some period of time while secondary 44 remains inactive. Under these conditions, current will flow from output terminal 56 through the neon tube load 22 into the improper ground connection. Secondary 44 is not energized and therefore will not generate a current flow in neon tube load 24 that would oppose the current flowing from neon tube load 22 into ground. Thus, virtually all of the current from output terminal 56 must flow through neon tube load 22, into and through ground, into the transformer ground terminal 62 and into the ground fault detector circuit 18. This current will be detected in the same manner as the ground fault current discussed above in connection with FIG. 7, preventing the neon transformer from operating with an unsafe and undetected ground fault due to grounding the middle of the tubing load.

Figure 9:
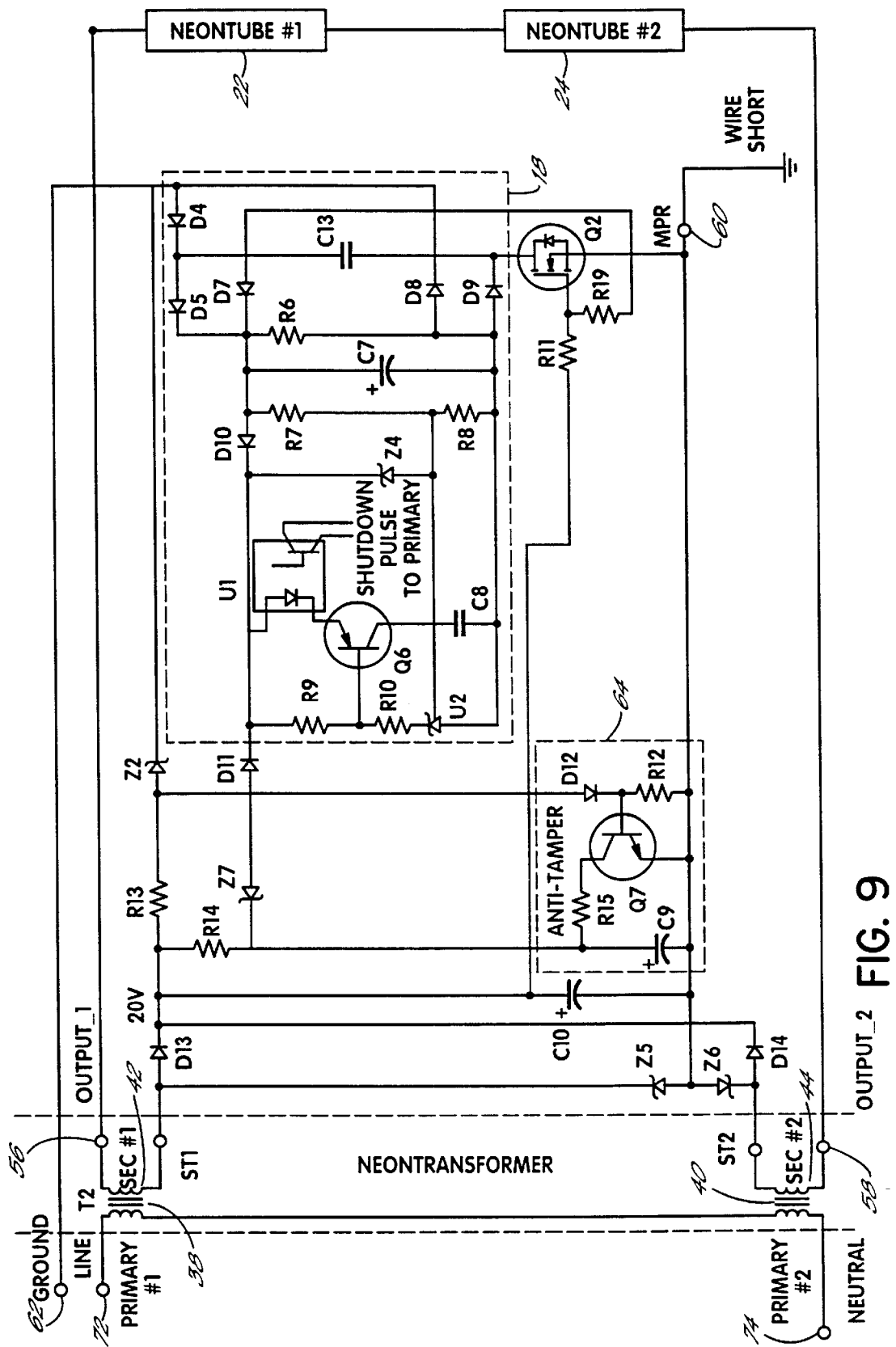
FIG. 9 is a diagram of the secondary circuitry of FIG. 8, in which the midpoint return connection has been shorted to a path to ground.

FIG. 9 shows a condition where the midpoint return terminal 60 is shorted to earth ground either deliberately or inadvertently. This would cause ground fault return currents to bypass the ground fault detect circuit 18 and thus render the transformer circuit incapable of detecting a ground fault or grounded tubing within the sign installation. As discussed in the above-referenced U.S. Patent Application, the anti tamper circuit 64 detects this condition and de-energizes the transformer when this condition exists. Under normal conditions a small current flows from bias capacitor C10 through resistor R13, diode D12, and into the base of transistor Q7. This keeps transistor Q7 turned on and capacitor C9 discharged. During alternate half cycles fault current (if any) drives the ground terminal 62 negative with respect to the midpoint return terminal 60. At this time current through resistor R13 is diverted through zener diode Z2 into ground. Transistor Q7 then turns off allowing capacitor C9 to begin charging through resistor R14. However, capacitor C9 and resistor R14 have a time constant significantly longer than one half cycle of the line. Before capacitor C9 can charge to a substantial voltage, the next half cycle of the line drives ground terminal 62 positive with respect to the midpoint return terminal 60. Transistor Q7 is again turned on, capacitor C9 discharged, and the anti tamper circuit remains inactive.

Now examine the circuit when a short is placed between the midpoint return and ground terminals as is the case in FIG. 9. Under these conditions, the current flowing through resistor R13 is diverted away from diode D12, through zener diode Z2 into the ground terminal 62, through the external ground wiring, through the wire short to the midpoint return terminal 60. Since no current is flowing in the base of transistor Q7, transistor Q7 remains off, and capacitor C9 charges toward the voltage across capacitor C10. When the voltage across capacitor C9 reaches a sufficient level, current flows through zener diode Z7, diode D11, and zener diode Z4 to the input terminal of shunt regulator U2. This turns on regulator U2, transistor Q6 and isolator U1 in the manner discussed above, sending a SHUT DOWN signal to the primary control circuit. This prevents disabling the ground fault detect circuit 18 by shorting the midpoint return terminal 60 to ground.

One deviation of the circuit of FIGS. 7–9 from the circuit shown in FIG. 3 of the above-referenced U.S. Patent Application, is that transistor Q2 is interposed between detector circuit 18 and the midpoint return terminal 60. The gate of transistor Q2 is connected to the node between resistors R11 and R19, which are connected across capacitor C10 and divide the voltage across capacitor C10. This enables the ground fault detect circuit 18 to operate only when current flows in either secondary, and disables the detect circuit when no current flows in the secondaries and capacitor C10 discharges. This prevents loading of the chassis ground terminal by the ground fault detect circuit 18 when no current is flowing in the secondary. The value of this function will become clear when the primary circuitry is discussed.

Figure 10:
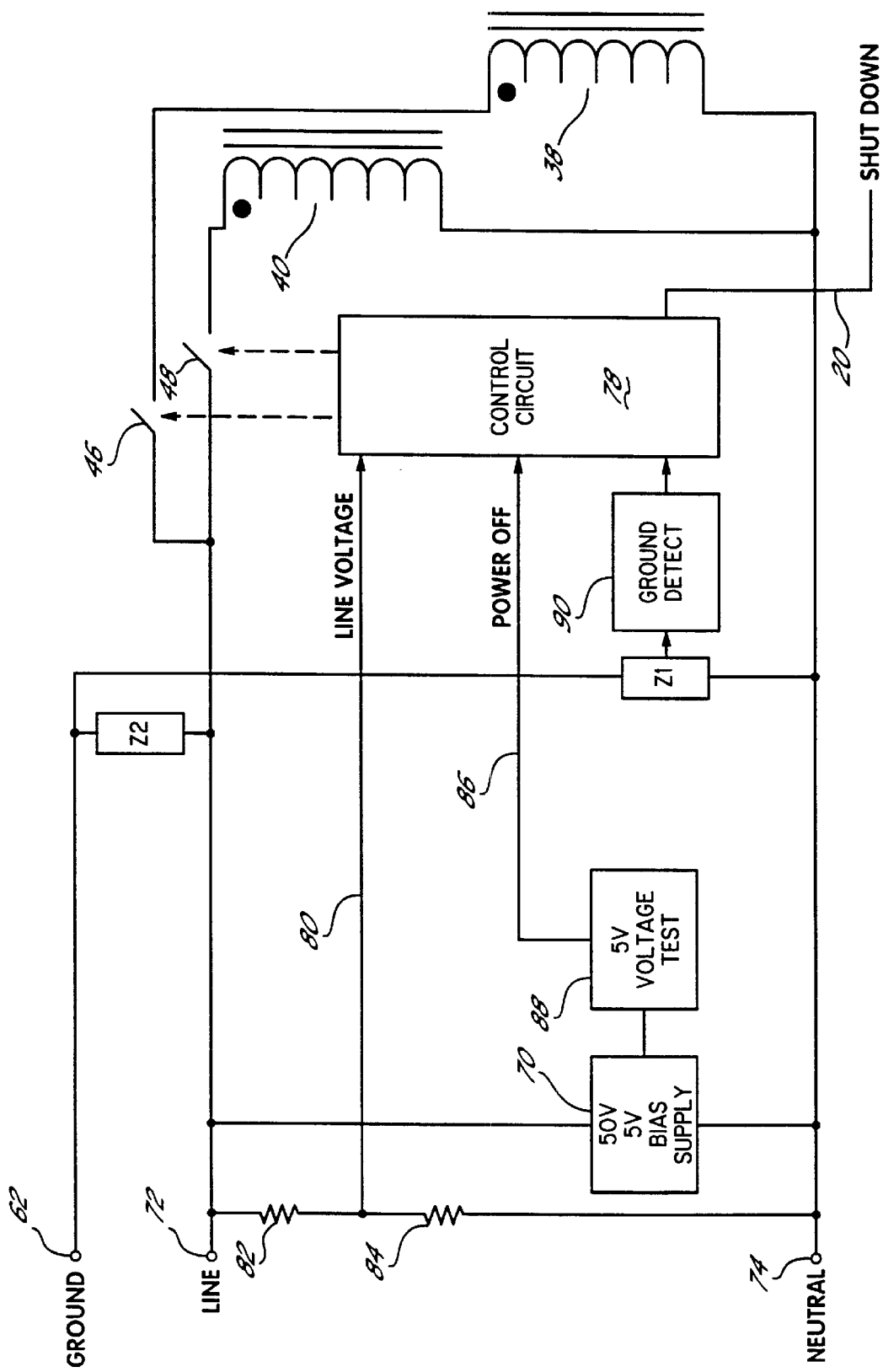
FIG. 10 is a block diagram of primary control circuitry for use with the secondary circuitry of FIGS. 7–9.

Referring now to FIG. 10, the circuitry controlling the primary windings of the transformer can be explained in detail. This circuitry includes a bias power supply for generating 50 Volt and 5 Volt DC bias voltages useable as power supplies, from the higher voltage AC power available from the line terminal 72 relative to the neutral terminal 74. The 50 Volt bias power supply is used to drive relays and other circuitry in the primary side of the transformer circuit, and the 5 Volt power supply is used by the microprocessor and other electronics in the primary circuitry.

The core of the primary circuitry is a control circuit 78, which may include a microprocessor or other logic circuitry. Control circuit 78 is responsive to input signals to control the switches 46 and 48 which apply power from the line terminal 72 to the primary windings 38 and 40, respectively.

Control circuit 78 receives the SHUT DOWN signal on line 20 from the secondary circuitry, and responds by opening switches 46 and 48 to disconnect power from the primary windings 38 and 40.

Further, control circuit 78 is connected to an analog line voltage signal on line 80. Line 80 is connected to the node between resistors 82 and 84, which are connected in series between line terminal 72 and neutral terminal 74 and divide the AC input voltage to a smaller voltage signal on line 80 which can be detected by control circuit 78. This analog voltage signal is utilized within control circuit 78 to detect the current phase of the input line voltage, to permit synchronization of closing and opening the switches 46 and 48 with the line cycles to reduce inrush current.

Control circuit 78 is further connected to a POWER OFF signal on line 86, produced by a voltage test circuit 88. Test circuit 88 detects whether the 5 Volt supply voltage from circuit 70 has dipped substantially below 5 Volts DC, indicating that power has been disconnected from line terminal 72. If a voltage sag is detected, test circuit 88 generates a POWER OFF signal to control circuit 78, causing control circuit 78 to open switches 46 and 48 and terminate further operation of control circuit 78.

Control circuit 78 is further connected to the output of a ground detect circuit 90. Ground detect circuit 90 detects current flow through the impedances Z1 and Z2 connected between the line, neutral and ground terminals 72, 74 and 62, and detects conditions suggesting that the ground terminal has not been connected to earth ground, or suggesting that the line and neutral connections have been reversed. Upon detection of such conditions by ground detect circuit 90, control circuit 78 opens switches 46 and 48 disconnecting electrical power from primary windings 38 and 40, thus preventing operation without an earth ground and correct line and neutral connections. The mechanism for detecting reverse wiring and a missing ground connection is similar to that described in the above-referenced U.S. patent application Ser. No. 08/838,060, and is discussed in further detail below with reference to FIG. 11.

Figure 11:
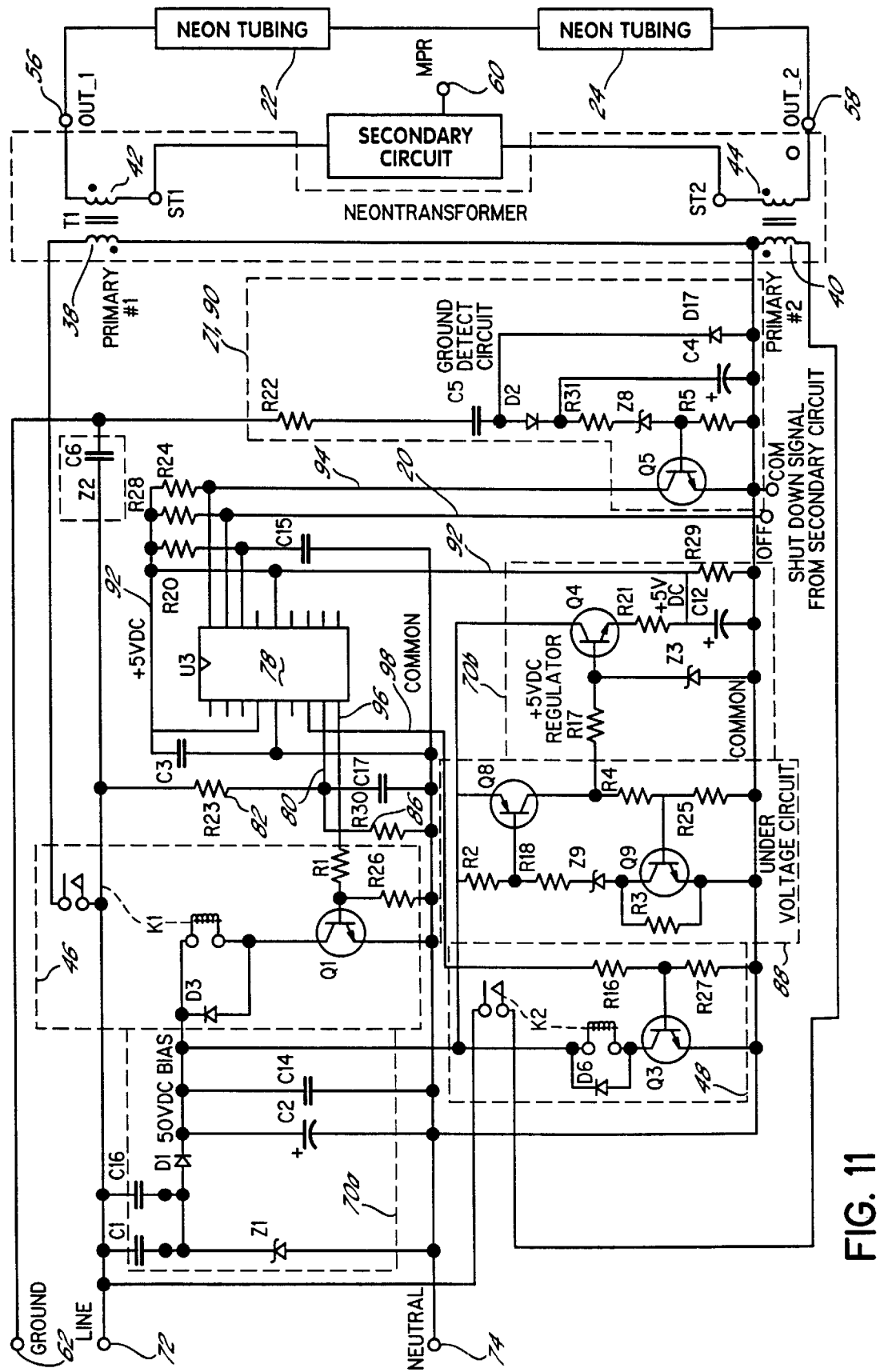
FIG. 11 is a diagram of primary control circuitry corresponding to the block diagram of FIG. 10, coupled to the primary windings for appropriately delivering power thereto.

Referring now to FIG. 11, a detailed circuit implementation of the functions of the blocks illustrated in FIG. 10 can be explained.

The 50 volt portion 70*a* of the bias supply 70 is substantially similar to that described in the above-referenced U.S. patent application Ser. No. 08/838,060, as shown in FIG. 2 of that application. Capacitors C1 and C16 are connected in parallel with one lead of each connected to the input line terminal 72, and their opposing leads connected through zener diode Z1 to the neutral terminal 74. On the positive half cycle of the line, current flows from the line terminal 72 through capacitors C1 and C16 through diode D1, into capacitors C2 and C14 to the neutral input terminal. After several line cycles the voltage across capacitors C2 and C14 reaches approximately 50 Volts DC at which time zener diode Z1 begins to conduct from cathode to anode, shunting the current away from capacitors C2 and C14, thereby limiting the voltage across capacitors C2 and C14 to approximately 50 Volts DC. During the negative half cycle of the line, current flows from the neutral terminal through zener diode Z1 anode to cathode, through capacitors C1 and C16 to the line terminal 72. This reverses the charge accumulated on C1 and C16 during the positive half cycle of the line in preparation for another positive charging cycle. Thus a 50 Volt DC bias is developed across capacitors C2 and C14.

The control circuit 78 comprises a micro processor integrated circuit U3, which must have a well controlled 5 Volt DC bias voltage. Microprocessor U3 may be damaged by applying a bias voltage greater than 6 Volts DC, and at voltages significantly less than 5 Volts DC, microprocessor U3 may produce erroneous outputs that interfere with proper operation. Therefore, the bias supply 70 includes a 5 Volt DC voltage regulator 70*b* used to provide the proper 5 Volt DC bias to microprocessor U3. The 50 Volt DC bias is used as a source for the 5 Volt DC bias.

The regulator circuit comprises the series combination of transistor Q4, resistors R21 and R29 and capacitor C12 which is in parallel with resistor R29. 5.6 Volt zener diode Z3 is connected between the base of transistor Q4 and circuit common. The base current for transistor Q4 is supplied through resistor R17 from the undervoltage circuit 88 so long as the voltage across capacitor C12 remains at substantially 5 Volts, as explained below. Current flowing through resistor R17 into the base of transistor Q4 turns transistor Q4 on. Current then flows from the 50 Volt DC bias into the collector of transistor Q4 out the emitter, through R21 to capacitor C12. When capacitor C12 charges to approximately 5 Volts DC, the sum of the voltages across capacitor C12, resistor R21, and the base emitter junction of transistor Q4 reaches approximately 5.6 Volts DC. At that time zener diode Z3 begins conducting which diverts some of the current in R17 away from the base of transistor Q4. Thus the voltage on capacitor C12 is limited to approximately 5 Volts DC, and protected from excessive voltage. The voltage on capacitor C12 thus serves as a 5 Volt DC bias voltage and is connected via line 92 to microprocessor U3 and to other circuitry utilizing a 5 Volt DC bias.

The undervoltage circuit 88 comprises resistors R2 and R18, connected in series with zener diode Z9 and the parallel combination of NPN transistor Q9 and resistor R3. Also included in the undervoltage circuit is PNP transistor Q8 connected in series with resistors R4 and R25. The base of transistor Q8 is connected to the node between resistors R2 and R18 and the base of transistor Q9 is connected to the node between resistors R4 and R25.

In use, the undervoltage circuit 88 prevents operation of microprocessor U3 when significantly less than 5 Volts DC can be generated across capacitor C12. One end of resistor R2 is connected to the 50 Volt DC bias with the other end connected to the base of transistor Q8 and one end of R18. Initially, when the AC power is applied, transistor Q8 is in the off state. No current will flow in R2 or in the base of transistor Q8 until the 50 Volt DC bias reaches a level sufficient to cause zener diode Z9 to conduct, approximately 9 Volts. Current then flows from the 50 Volt DC bias through R2 and R18, through zener diode Z9, through resistor R3 to common. Transistor Q9 is initially non conducting. When the voltage level of the 50 Volt DC bias reaches approximately 12 Volts DC, the voltage across R2 reaches 0.6 Volts which then allows current to flow in the emitter to base junction of transistor Q8 turning it on. Current then flows from the 50 Volt DC bias into the emitter of transistor Q8, out the collector of transistor Q8, and through resistor R17 to turn on the 5 Volt DC regulator. Current from the collector of transistor Q8 also flows through resistor R4, and through resistor R25 and the base of transistor Q9, turning on transistor Q9 which shunts current flowing through resistor R3. This further increases the current flowing into the base of transistor Q8, and the current flowing through resistor R18, and zener diode Z9. The decreased voltage across resistor R3 (equal to the saturated collector-emitter voltage of transistor Q9) lowers the voltage at which the under voltage circuit 88 will turn off providing hysteresis.

When the AC input power is removed, the 50 Volt DC bias will begin to decay toward 0 Volts DC. When the 50 Volt DC bias decays to approximately 10 Volts DC, the current through resistor R18 and zener diode Z9 will no longer be sufficient to generate a voltage of 0.6 Volts across resistor R2, which will cause transistor Q8 to turn off. This interrupts the current flowing through resistor R17 which drives the 5 Volt DC regulator, reducing the 5 Volt DC bias level on line 92 to approximately 0 Volts, causing micro processor U3 to halt operation, eliminating erratic operation. In this manner the micro processor is prevented from operating when an insufficient power supply voltage could result in improper operation.

The primary transformer circuitry illustrated in FIG. 11 also includes a ground detection function. The ground fault current detect circuit 18 (FIG. 5 etc.) may not detect a ground fault if the neon transformer is not properly grounded. Additionally, in the event of a miswiring the metallic case housing of the neon transformer and could become energized to voltages which are potentially hazardous to personnel. The ground detection functions prevent operation of the neon transformer if installed without a safety ground connection. If the input ground terminal is not connected to the safety ground the microprocessor U3 prevents application of AC power to the neon transformer.

The ground detect function is provided by capacitor C6, which forms impedance Z2 of FIG. 10, connected between the line terminal 72 and ground terminal 62, as well as impedance Z1 and ground detect circuit 90 of FIG. 10, comprising the series combination of resistor R22, capacitors C4 and C5, and diodes D2 and D17, resistor R31, zener diode Z8, transistor Q5 and resistor R5. The collector of transistor Q5 is connected to an input line 94 of microprocessor U3 and to a pull-up resistor R24 leading to the 5 Volt DC bias on line 92, to provide a ground detection signal to microprocessor U3.

In use, under normal conditions, a small current flows from the line terminal 72 through capacitor C6 to the chassis ground terminal 62 and to earth ground. However if the installer does not connect the safety earth ground wire to the chassis ground terminal, this current will flow through the ground detect circuit 90. During the negative half cycle of the line voltage, current flows from the neutral terminal 74 through diode D17, through capacitor C5, through resistor R22, through capacitor C6 to the line terminal 72. During the positive half cycle of the line, current flows from the line terminal 72 through capacitor C6, through resistor R22, through capacitor CS, through diode D2, and into capacitor C4. When the voltage across capacitor C4 reaches the break over voltage of zener diode Z8, current flows from capacitor C4 through resistor R31, zener diode Z8, and through resistor R5 and the base of transistor Q5. This causes transistor Q5 to turn on and current flows from the 5 Volt DC bias through pull-up resistor R24 into the collector of transistor Q5 to common. The voltage on the collector of transistor Q5 at line 94 switches from a logical high to a logic low. Microprocessor U3 interprets this low signal on line 94 as an undesirable operating condition and prevents the neon transformer from energizing. In this manner operation without a ground connection is prevented.

The ground detect circuit also generates a low signal on line 94 if the line and neutral leads are reversed by the installer or if the power line distribution is reversed at some point. In this case line voltage will be present between the chassis ground and the incorrectly connected neutral terminal 74. Current will flow from the earth ground to chassis ground through resistor R22, capacitor C5, and diode D2 as previously discussed. Capacitor C4 will be charged to a voltage sufficient to break over zener diode Z8, allowing current to flow from capacitor C4 through resistor R31, through zener diode Z8 into the base of transistor Q5. This base current causes transistor Q5 to turn on generating a logic low signal line 94. This is sensed by microprocessor U3, which removes power from the neon transformer. In this manner an unsafe condition is detected by the ground detect circuit, preventing operation with reversed line leads.

In addition to receiving power on line 92 and a ground detection signal on line 94, the microprocessor U3 receives a voltage divided version of the AC line on line 80, produced by the series connected resistors 82 and 86 connected between line and ground. Microprocessor U3 further receives the SHUT DOWN signal on line 20 from the secondary ground fault current detect circuit 18. Utilizing these inputs from the incoming line, ground sense circuit 90, and the secondary ground fault current detect circuit 18, microprocessor U3 determines the proper sequence and timing to turn on or off the two neon transformer primaries. The sequence and timing information is an integral part of the software used to program microprocessor U3, and is detailed in the flow chart of FIG. 12.

Switch circuits 46 and 48 are connected to microprocessor U3 and controlled by microprocessor U3 to deliver AC power to primary windings 40 and 38 based upon conditions detected by the microprocessor U3. Switch circuit 46 comprises relay K1 which is connected between the line terminal 72 and primary winding 38. Resistor R1 is connected between output line 96 from microprocessor U3 and the base of transistor Q1. The collector of transistor Q1 is connected to one end of the coil of relay K1, the opposite end of the coil being connected to the 50 Volt DC bias. The emitter of transistor Q1 is connected to common. Resistor R26 is also connected between the base and emitter of transistor Q1. Switch circuit 48 comprises relay K2 which is connected between the line terminal 72 and primary winding 40. Resistor R16 is connected between output line 98 from microprocessor U3 and the base of transistor Q3. The collector of transistor Q3 is connected to one end of the coil of relay K2, the opposite end of the coil being connected to the 50 Volt DC bias. The emitter of transistor Q3 is connected to common. Resistor R27 is also connected between the base and emitter of transistor Q3.

In use, to energize primary winding 38, microprocessor U3 produces a logic high output on line 96. Current will flow from microprocessor U3 through resistor R1 into resistor R26 and into the base of transistor Q1. This turns on transistor Q1 allowing current to flow from the 50 Volt DC bias through the coil of relay K1, into the collector of transistor Q1 and into common. The current flow in the coil of relay K1 causes the contacts of relay K1 to close, applying line voltage to primary 38 through the contacts of relay K1. To energize primary winding 40, microprocessor U3 produces a logic high output on line 98. Current will flow from microprocessor U3 through resistor R16 to resistor R27 and into the base of transistor Q3, turning transistor Q3 on. Current will then flow from the 50 Volt DC bias through the coil of relay K2, through transistor Q3 collector to emitter to common. This closes the contacts of relay K2 applying line voltage to primary winding 40 through the contacts of relay K2.

Figure 12:
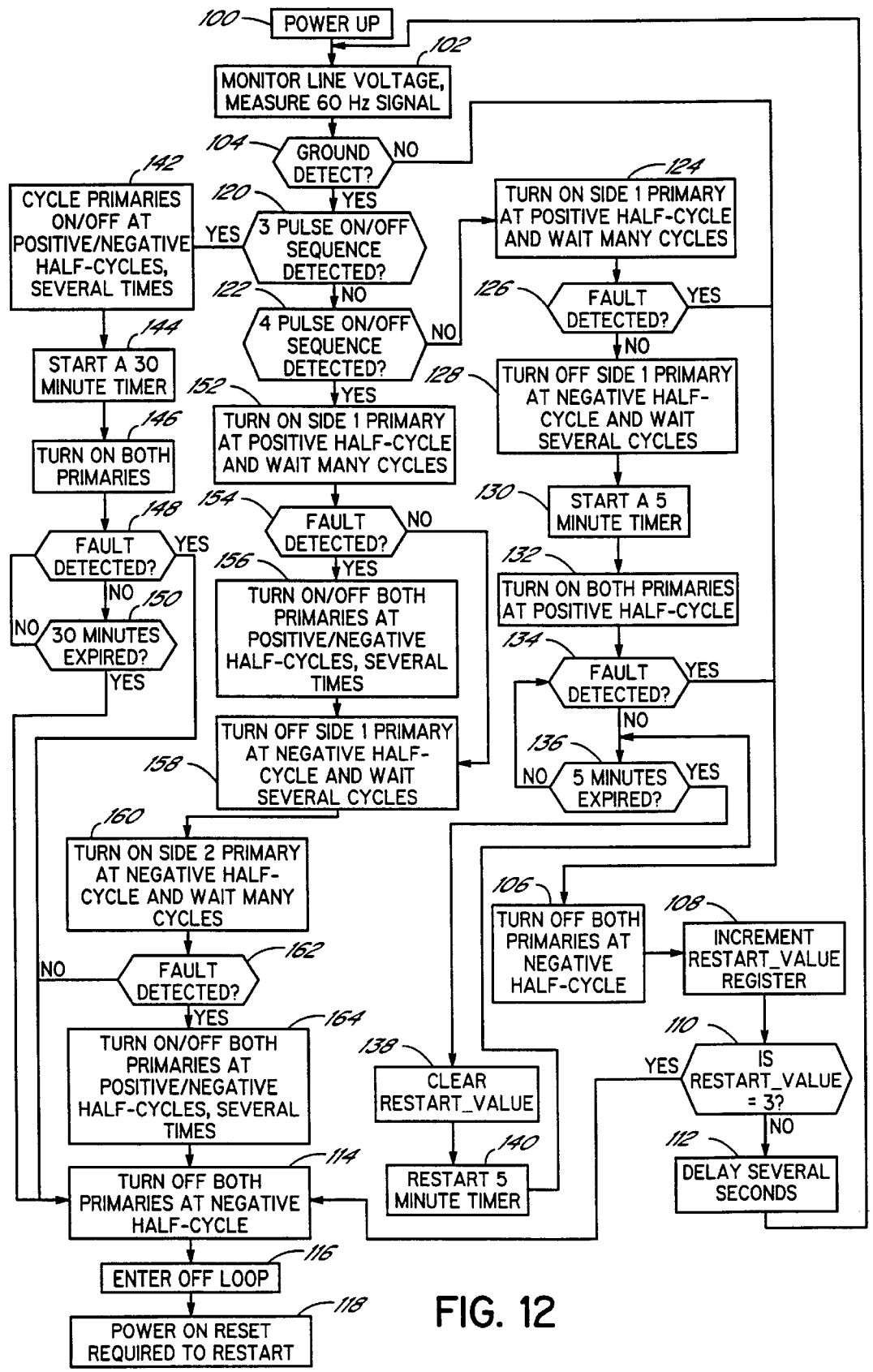
FIG. 12 is a flow chart of operations performed by the microprocessor in the primary control circuitry of FIG. 11.

Referring now to FIG. 12, the operations of microprocessor U3 in response to the ground sense, fault current detect, and line voltage inputs will be elaborated. Input bias power is applied to microprocessor U3 when the input bias circuit 70 and undervoltage regulator 88 have determined that the 5 Volts DC is available. At this time, circuitry internal to microprocessor U3 initializes 100 the various input/output pins for the correct function as determined by the software program. Further, internal registers, including a Restart_Value register, are cleared for future use. An internal clock, the frequency of which is determined by resistor R20 and capacitor C15 (FIG. 11), is initialized. Microprocessor U3 then calibrates this clock frequency by monitoring 102 the line voltage at line 80 to determine the number of clock cycles which appear during a single 60 Hz line cycle. Subsequent time delays and other time periods that are generated by microprocessor U3 are produced by assuming that the number of clock cycles counted in step 102 equals 1/60 of a second in time. Finally, microprocessor U3 delays for a time period to permit the 50 Volt DC bias circuit 70 to charge to full voltage. Furthermore, during this time period microprocessor U3 monitors 102 the line voltage to determine if the line voltage is being intermittently applied and removed in a specific pattern used to request a test or diagnostic mode of the transformer circuit (see below).

After this initialization, microprocessor U3 checks 104 the ground detect signal on line 94 to determine if the ground, line and neutral connections have been correctly made. In the event of a missing ground connection or reverse wiring, microprocessor U3 will attempt three times to restart, and then latch into an "off" condition. This permits the installer time to connect the missing safety ground connection upon noticing that the neon tubing does not illuminate. It also improves the immunity of the circuit to noise and power surges which might falsely trip the ground detect circuit 90.

If in step 104, the signal on line 94 is a logic low, the ground detect circuit has determined that the safety ground is missing or that the line and neutral leads are reversed. In this situation, microprocessor U3 proceeds to step 106 and sets a logic low level at output lines 96 and 98 to ensure that neither primary winding is energized. Then, in step 108, the Restart_Value register is incremented, to indicate that the microprocessor has failed to start. Then in step 110, the value in the Restart_Value register is compared to three. After the first pass through step 108, the value in the Restart_Value register will be one, and microprocessor U3 will proceed to step 112, in which further processing will delay for several seconds, and then return to step 102. If the safety ground is still not connected, or reverse wiring condition continues, then the microprocessor U3 will twice proceed through the loop including steps 102, 104, 106, 108, 110 and 112. At the third pass through step 110, however, the value of the Restart_Value register will reach the value of 3, and processing will proceed to step 114, where microprocessor U2 sets a logic low level at output lines 96 and 98 to ensure that neither primary winding is energized. After de-energizing the primary windings in step 114, microprocessor U3 enters an endless loop in step 116. Once microprocessor U3 has reached step 116, it will remain latched in an "off" condition and can only be restarted by removing and reapplying power from/to the transformer circuit, causing a power-on reset of the microprocessor program (step 118). Thus, if after three tries spaced several seconds apart, the ground detect circuit 90 identifies an error condition, microprocessor U3 will latch in an "off" condition until power is removed and restored.

If, however, the ground detect circuit 90 does not identify a miswiring or missing ground, either initially or after the first or second retry, in step 104 a logic high signal will be detected on line 94, and processing will proceed to step 120. In step 120, microprocessor U3 will evaluate the AC line behavior, as monitored from line 80 during step 102, to determine whether power has been applied and removed in a specific pattern, forming three 50 msec periods of alternating power application and removal. This pattern is used by the diagnostic analyzer, described below in connection with FIGS. 13–16, to initiate a test mode of the transformer control circuit. Assuming this pattern is not received, in step 122, microprocessor U3 will evaluate the signal previously received on line 80 during step 102, to determine whether power has been applied and removed in a specific pattern forming four 50 msec periods of alternating power application and removal. This pattern is used by the diagnostic analyzer, to initiate a fault diagnosis mode of the transformer control circuit.

Assuming neither of these patterns are received, microprocessor U3 enters its normal operative mode by proceeding to step 124. In step 124, microprocessor U3 will wait until a positive half-cycle of the AC line as indicated by a high signal on line 80, and then energize primary 38 by raising output line 96 to a logic high. Current will flow from microprocessor U3 through line 96 causing line voltage to be applied to primary 38 through the contacts of relay K1, producing an output voltage at output terminal 56, but no significant voltage at output terminal 58. Thus, as described above, power is applied to one side only of the gas tubing load connected to the secondary windings.

It will be noted that in step 124 and other steps in which power is applied to a primary winding, microprocessor U3 waits until a positive half-cycle of the AC line before closing the associated relay and applying power to the primary winding. Furthermore, in steps where microprocessor U3 removes power from a primary winding, microprocessor U3 waits for a negative half-cycle of the AC line before opening the associated relay. This assures that when the transformer is de-energized, the residual flux in the core will be negative, and that when the transformer is re-energized, the initial positive half cycle of the AC line will initially drive the flux in the core in a positive direction, opposed to the residual flux in the core. This increases the likelihood that the flux density in the core will remain in the linear region of the core, and inrush current will be accordingly reduced.

After thus applying power only to output terminal 56, in step 126, microprocessor U3 monitors input line 20 which carries the SHUT DOWN signal from the from the ground fault current detect circuit 18. In the absence of a detected ground fault current line 20 is in a logic high state. Microprocessor U3 will keep primary 38 energized for several tenths of a second so long as no SHUT DOWN signal is generated by the secondary circuit.

If no SHUT DOWN signal is detected in step 126, microprocessor U3 will proceed to step 128. In step 128, microprocessor U3 waits for a negative half cycle of the line voltage detected at input line 80, and then switches output line 96 to a logic low level, which turns off transistor Q1 and relay K1, removing line voltage from primary 38 and de-energizing output terminal 56. Microprocessor U3 will remain in step 128, maintaining output line 96 in a low state, for several tenths of a second, and then proceed to step 130.

In step 130, microprocessor U3 starts a five minute timer. Then, in step 132, microprocessor U3 waits for a positive half-cycle of the line as detected on line 80, and then raises both output lines 96 and 98 to logical high states. The high state of line 96 will cause primary 38 to be energized as previously detailed. The high state of line 98 will cause relay K2 to close, energizing primary winding 40. Thus, at approximately the same time, power is applied to primaries 38 and 40 and thus to both output terminals 56 and 58, providing power to operate the neon sign.

Once power has been applied, microprocessor U3 enters a loop comprising steps 134 and 136. In step 134, microprocessor U3 determines whether a fault has been detected, as indicated by a SHUT DOWN signal on line 20 or a missing ground signal on line 94. If either fault is detected, microprocessor U3 proceeds to step 106 described above, to de-energize the primary windings, and then through steps 108 and 110 to increment the Restart_Value register and determine if the Restart_Value has exceeded three. Thereafter, as described above, microprocessor U3 will attempt to restart the primary windings until three restart attempts have occurred, in which case, microprocessor U3 will latch into an "off" condition.

If no fault is detected in step 134, then in step 136, microprocessor U3 determines whether the five minute timer has expired. If not, then microprocessor U3 loops to step 134 to determine whether a fault has been detected.

When the five minute timer has expired, microprocessor U3 proceeds from step 136 to step 138, in which the Restart_Value register is cleared, and then to step 140, in which the five minute timer is restarted. Microprocessor U3 then returns to step 136. Thus, if no faults are experienced within any given five minute period, the Restart_Value register is cleared. As a result, three faults must be detected within a reasonably short period of time, for the microprocessor U3 to latch into the "off" condition. If faults are experienced spaced by more than five minutes, these faults will not cause microprocessor U3 to latch into an "off" condition. Accordingly, there is some immunity from surges and other transient causes of faults.

If there is a wiring fault at the secondary side, for example if the midpoint of the tubing is connected to ground as shown in FIG. 8, this fault will result in a SHUT DOWN signal on line 20, which will be detected by microprocessor U3 in step 126, and microprocessor U3 will proceed directly from step 126 to step 106, thus causing the primary windings to be de-energized (step 106), incrementing the Restart_ Value (step 108), and determining whether to attempt a restart or latch into an "off" condition (step 110).

As noted above, the program in microprocessor U3 includes steps 120 and 122 which analyze the AC line voltage for pulse sequences indicative of test or diagnostic modes. Troubleshooting a neon sign installation with a secondary ground fault interrupter equipped neon transformer, is difficult because ground faults are not always detectable by visual inspection. Often, power must be applied to the transformer to enable testing and location of faulty connections. Unfortunately, the presence of a ground fault interrupter in a transformer circuit prevents "power-on" diagnosis, because the ground fault interrupter will disconnect power as a result of the fault. The program in microprocessor U3 avoids this dilemma by providing a test mode which defeats the ground fault interrupter for the purpose of troubleshooting. In the interest of safety, this test mode can be enabled only by deliberate action on part of the user, and will only be active for 30 minutes. This allows troubleshooting of the installation under power but prevents unattended operation with the ground fault interrupting features defeated.

This test mode is activated by a sequence of three on/off 50 msec pulses of the AC line, followed by continuous application of AC line power. No natural phenomenon is likely to produce this sequence. When this sequence of pulses is detected in step 102, microprocessor U3 responds by sequencing from step 120 to step 142. In step 142, the microprocessor U3 provides visual verification that the unit has entered the timed test mode, by turning both primary windings on and off several times at a rate of approximately one second on and one second off. As noted above, the primaries are turned on at positive half-cycles of the AC line and off at negative half-cycles of the AC line, to reduce inrush current. This will cause the tubing to flash on and off to indicate that the timed test mode is active. Following step 142, in step 144 a thirty minute timer is initialized, and then in step 146 both primaries are turned on at the positive half-cycle of the AC line. Thereafter, microprocessor U3 enters a loop including steps 148 and 150. In step 148, microprocessor U3 determines whether there is a low signal on line 94 indicating that the ground detect circuit 90 has detected a missing ground or reverse wiring fault. (These fault detection features are not defeated during the test mode.) If so, microprocessor U3 proceeds directly to step 144, turns off both primaries and then to step 146 where microprocessor U3 latches into an "off" state. If no missing ground or reverse wiring fault occurs, microprocessor U3 proceeds from step 148 to step 150, at which the state of the thirty minute timer is evaluated. If the thirty minute timer has not expired, microprocessor U3 returns to step 148. If the thirty minute timer has expired, microprocessor U3 proceeds to step 114 to turn off both primaries and enter a latched "off" state.

Microprocessor U3 is also programmed to provide an active trouble shooting mode. This enables the microprocessor to diagnose and indicate likely areas of the sign installation to examine for faulty or incorrect wiring. The following specific conditions can be detected and identified:

1. Ground fault on output terminal 56;
2. Ground fault on output terminal 58;
3. Ground connection in middle of the tubing, or at midpoint return, or at both output terminals 56 and 58.

The diagnostic mode is activated when, in step 102, microprocessor U3 detects a sequence of four on/off cycles of the AC input line voltage of approximately 50 milliseconds for each on or off period, followed immediately by continuous line voltage connection. Microprocessor U3, recognizing this sequence, will proceed from step 122 to step 152, in which microprocessor U3 energizes primary winding 38 at a positive half-cycle of the AC line, and leaves primary winding 38 energized for a period of several seconds to determine whether there is a ground fault on output terminal 58. In step 154, microprocessor U3 determines whether a ground fault was detected, and if so, in step 156, microprocessor U3 cycles both primaries on and off rapidly several times, to indicate detection of a secondary ground fault on secondary no. 1. The flashing of any functional tubing or an output voltage indicating device such as a test lamp or voltmeter will serve as a visual indication of a fault.

After several seconds of flashing in step 156, or after an equal-length period without flashing, microprocessor U3 proceeds to step 158, and turns off both primaries 38 and 40, and then delays for approximately one second.

After a delay of approximately one second in step 158, microprocessor U3 proceeds to step 160 and energizes primary winding 40, resulting in activation of output terminal 58 for a period of several seconds to determine if a ground fault exists on output terminal 58. If a secondary ground fault is detected, microprocessor U3 will proceed from step 162 to step 164 and cycle both primaries 3 8 and 40 on and off, providing a visual indication that a ground fault was detected at secondary no. 2. If no fault is detected in step 162, or after flashing in step 164, microprocessor U3 proceeds to step 114 and turns both primary windings off, and then proceeds to step 116 and latches into an "off" condition.

Using the diagnostic mode described above, an installer can distinguish between several different fault conditions. If the tubing flashes only during the first interval, there is a fault connected to secondary no. 1 (output terminal 56). If the tubing flashes only during the second interval, there is a fault connected to secondary no. 2 (output terminal 58). If the tubing flashes indicating a secondary ground fault during both intervals, there are several possible ground fault conditions that might exist. The middle of the tubing, or the midpoint return terminal, or both outputs 56 and 58 might be connected to a ground fault. The identification of these conditions guides the installer to the proper portion of the sign to aid in troubleshooting.

Figure 13:
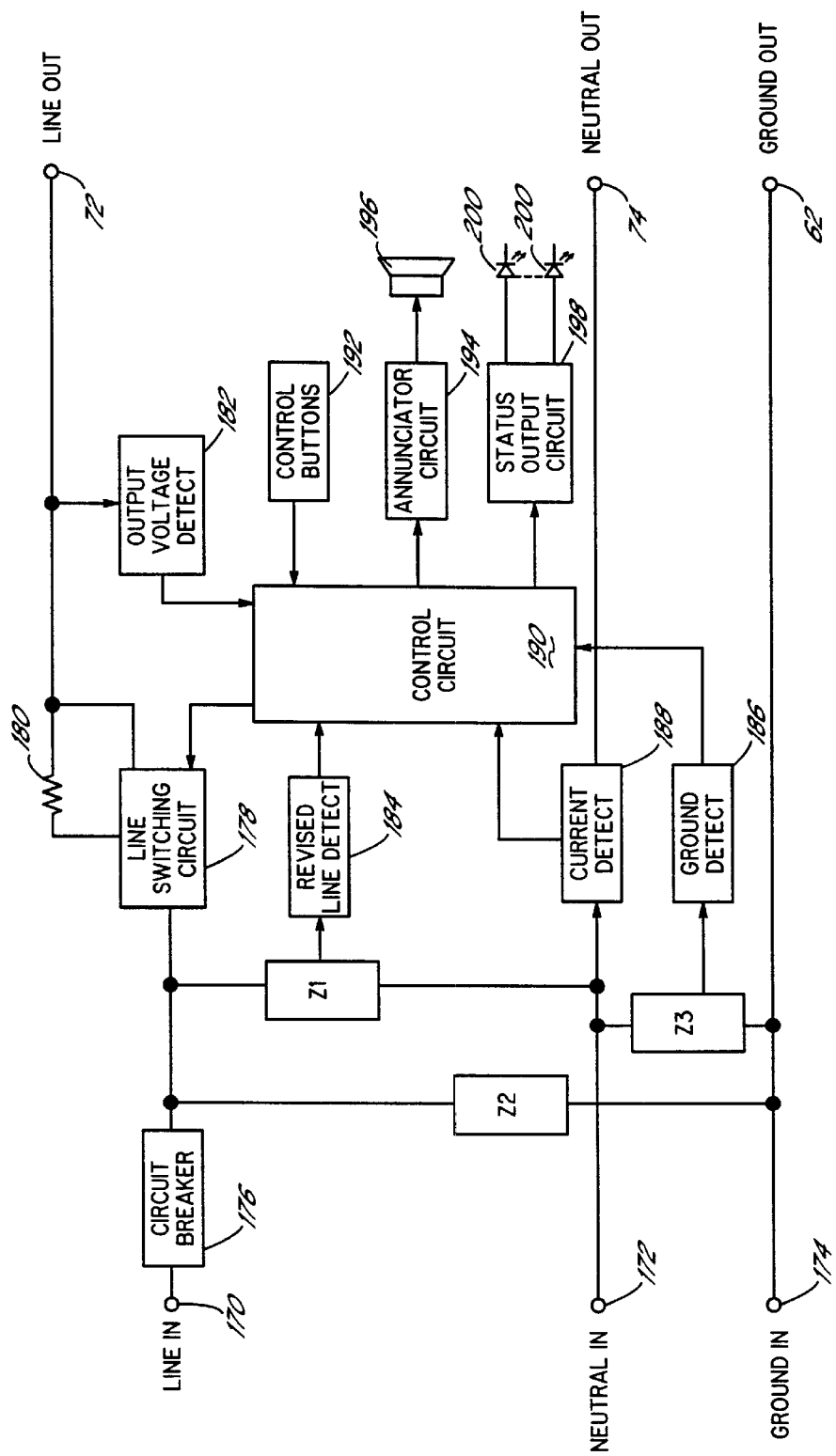
FIG. 13 is a block diagram of a diagnostic analyzer for connection to the primary control circuitry of FIGS. 10 and 11 for troubleshooting neon tubing connections.

Referring now to FIG. 13, there is illustrated a Diagnostic Analyzer used to aid service personnel in diagnosis of problems in a sign installation. The Diagnostic Analyzer is connected between the line, neutral and ground terminals 72, 74 and 62 of the transformer circuit illustrated in FIG. 11, and line, neutral and ground connections 170, 172 and 174 from the AC line. The Diagnostic Analyzer includes various functional elements to assist in diagnosis of the transformer circuit to which it is connected. Firstly, a circuit breaker 176 is connected between the line input terminal 170 and the remainder of the circuit, to protect the Diagnostic Analyzer and transformer circuit from high fault currents. Connected between the circuit breaker and line output terminal is a line switching circuit 178. Switching circuit 178 includes a relay and triac switch for connecting line power from input terminal 170 to output terminal 72. Switching circuit 178 is also connected to an output resistance 180, and may connect line input 170 to line output 72 via resistance 180. An output voltage detector 182 is connected to line output 72 for detecting the line output voltage, which can be used to determine whether appropriate connections have been made to the transformer circuit, as discussed below.

Also included in the Diagnostic Analyzer are impedances Z1, Z2 and Z3, connected between the line, neutral and ground inputs for detecting correct connection of these inputs in a manner similar to that discussed above in connection with FIGS. 10–11. Impedance Z1 is connected to a reverse line detection circuit 184 which detects whether the line and neutral terminals 170 and 172 at the input of the Diagnostic Analyzer have been reversed. Impedance Z3 is connected to a ground detection circuit 186 which detects whether a ground connection has been made to ground terminal 174 of the Diagnostic Analyzer.

The neutral terminal 172 of the Diagnostic Analyzer is connected to the neutral terminal 74 of the transformer circuit via a current detection circuit 188, which generates a signal representative of the amount of return current flow through the neutral terminal, and thus the power consumption in the transformer circuit. This information is useful in diagnosing particular faults in the transformer circuit.

The heart of the Diagnostic Analyzer is a control circuit 190, which may comprise one or more microprocessors operating in response to the various signals from output voltage detection circuit 182, reverse line detection circuit 184, ground detection circuit 186, and neutral current detection circuit 188, and producing the appropriate control signals to line switching circuit 178 to operate and diagnose the transformer circuit connected to terminals 72, 74 and 62. Control circuit 190 is further responsive to a set of control buttons 192, which may be used by the installer to activate various modes of control circuit 190. After diagnosis of a condition of the connected transformer circuit, control circuit 190 signals the diagnosis to the installer via an annunciator circuit 194, which produces audible outputs indicative of diagnosed conditions through a speaker 196. Control circuit 190 is further connected to an output circuit 198 for illuminating light emitting diodes 200 indicative of diagnosed conditions.

Figure 14:
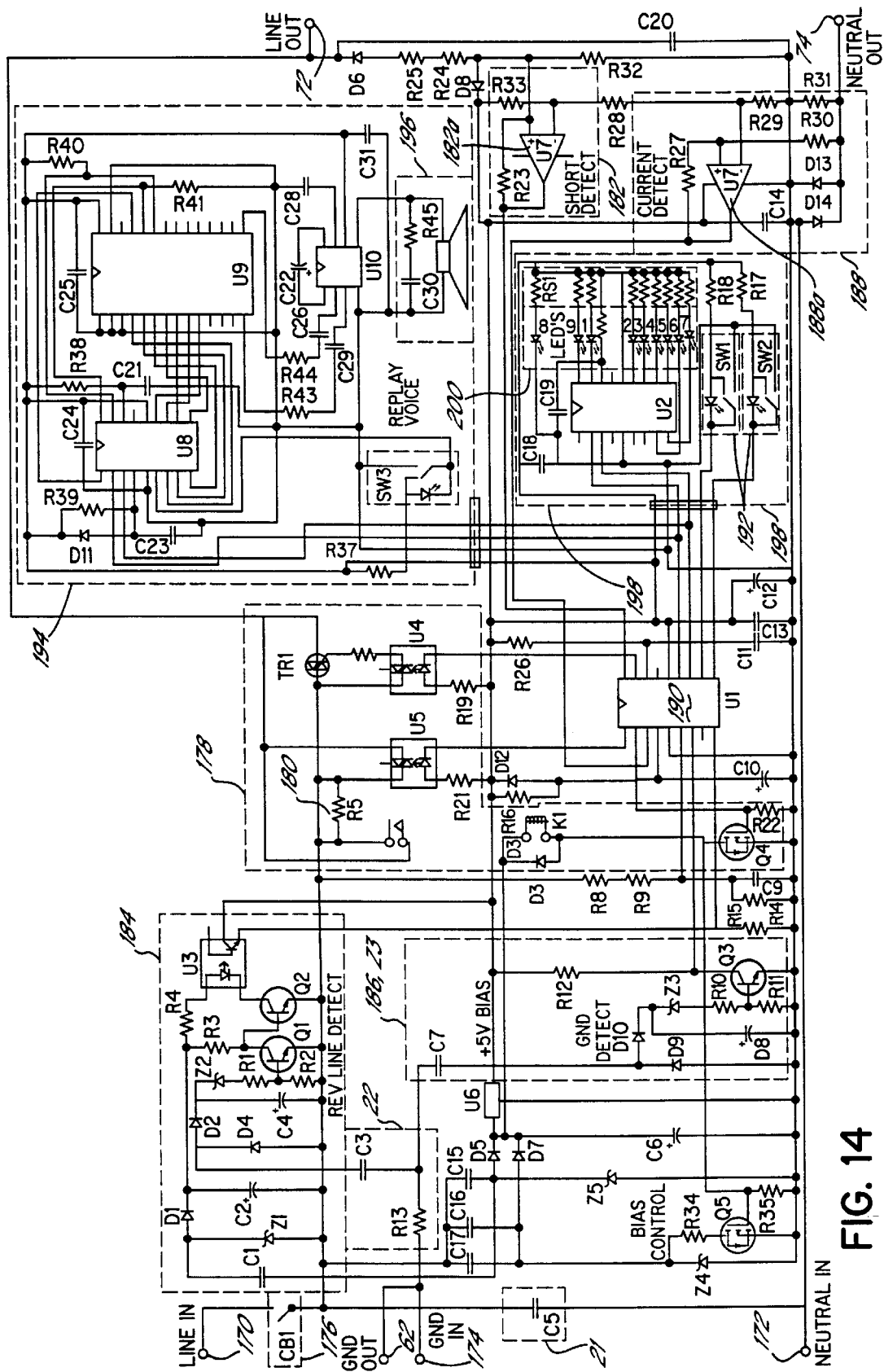
FIG. 14 is a diagram of diagnostic analyzer circuitry corresponding to the block diagram of FIG. 13.

FIG. 14 provides a detailed schematic illustration of one embodiment of the Diagnostic Analyzer, identifying the locations of circuit breaker 176, impedances Z1, Z2 and Z3, line switching circuit 178, output voltage detect circuit 182, reversed line detect circuit 184, ground detect circuit 186, neutral current detect circuit 188, control circuit 190 (which comprises a microprocessor integrated circuit U1), control buttons 192, status output circuit 198 (which includes a microcontroller U2), and annunciator circuit 194 (which includes a microcontroller U8 and memory U9 for storing annunciated waveforms).

Microprocessor U1 which comprises the control circuit 190, evaluates input from the panel mounted switches 92 to determine which function of the transformer circuit that the operator desires to activate. The three modes, as noted above, are diagnostic mode, 30 minute timed test mode with secondary ground fault bypass, and operational mode.

When one of these modes is activated by the switches 92, the Diagnostic analyzer appropriately controls the line switching circuit 178 to cause the transformer circuit to enter the appropriate mode, and then monitors current flow through the transformer neutral terminal 74 utilizing current detect circuit 188. The timing of the current flow through the transformer neutral terminal 74 is then analyzed by microprocessor U1, which then generates error code outputs. These error codes are transferred to the microcontroller in status output circuit 198 which lights one or more light emitting diodes to indicate the diagnosis of any installation problem. At the same time, another microcontroller in the annunciator circuit translates the error codes and activates a voice memory device which drives a speaker to produce voice messages defining the diagnosed problem.

The specific circuitry producing inputs to microprocessor U1 will now be discussed. 12 and 5 Volt bias supply voltages are generated within the Diagnostic Analyzer by circuitry similar to that discussed above with reference to FIG. 11, which will not be reviewed again.

The reversed line detector circuit 184 sends a signal to microprocessor U1 if the line and neutral input leads are reversed. While this condition exists the Diagnostic Analyzer will not provide output to the neon transformer under test. Visual and audible alarms will indicate this condition.

Normally a very small current flows from the Ground input lead 174, through resistor R13, through capacitor C3, through diode D2 and into capacitor C4 charging capacitor C4 to a level sufficient to break over zener diode Z2. Current through zener diode Z2 flows through resistor R1 into resistor R2 and the base of transistor Q1. This turns on transistor Q1 causing current to flow from capacitor C2, through resistor R3 into the collector of transistor Q1.

If the Line and Neutral leads are reversed, no current flows through resistor R13, capacitor C3, and diode D2 into capacitor C4 and into zener diode Z2, resistor R1 and the base of transistor Q1. Without base current, transistor Q1 turns off allowing the current through resistor R3 to flow into the base of transistor Q2. This turns transistor Q2 on, causing current to flow from capacitor C2 through resistor R4 into the photodiode of isolator U3 and into the collector of transistor Q2. Light from the photodiode of isolator U3 activates the transistor in isolator U3 so that current flows from the 5 Volt bias through transistor in isolator U3 and through resistor R15. A logic high voltage is developed across resistor R15 by this current. This logic high is connected to microprocessor U1 telling microprocessor U1 that the input leads are reversed. In response microprocessor U1 produces an output signal to microcontrollers U2 and U8. This output signal to microcontrollers U2 and U8 is an error code pulse train. Microcontroller U2 interprets the pulse train and forces produces a low output drawing current from the 5 Volt bias through resistor network RS1 through LED 2, which indicates reversed line. Microcontroller U8 interprets the pulse train and sends a binary code to voice memory chip U9. This causes the proper voice message signal to be delivered to audio amplifier U10, where it is amplified to drive speaker SPK1 to provide a voice message indicating the that the input Line and Neutral are reversed.

The ground detect circuit 186 sends a signal to microprocessor U1 indicating that the Diagnostic Analyzer input ground terminal is connected to earth ground. If this signal does not indicate the presence of a ground the microprocessor U1 disables the AC output to the neon transformer under test, and provides visual and audible indications of this condition.

When the ground terminal is not connected current flows from the input line terminal 170 through circuit breaker 176 (CB1), through diode D4, through capacitor C3, through capacitor C7, through diode D10, through zener diode Z3, through resistor R10, into resistor R11 and into the base of transistor Q3. This turns on transistor Q3 allowing current to flow from the 5 Volt bias supply through resistor R12 into the collector of transistor Q3. The voltage on the collector of transistor Q3 becomes a logic low level which is delivered to microprocessor U1. This tells microprocessor U1 that the ground connection is missing. Microprocessor U1 in response sends an error code to microcontrollers U2 and U8 which activate the visual and voice error indications as previously described.

Normally the ground terminal 174 is connected to ground and no significant voltage appears between the ground and neutral input terminals 174 and 172. In this case, current flowing from the input line terminal 170 through circuit breaker 176, through diode D4, through capacitor C3, flows through resistor R13, through the safety ground connection to the AC mains distribution. Thus, when ground is connected, no significant current flows through capacitor C7, through diode D10, through zener diode Z3, through resistor R10, into resistor R11 or into the base of transistor Q3. Transistor Q3 thus remains in the off state so that the collector voltage of transistor Q3 and the input signal to microprocessor U1 remains at a logic high. This tells microprocessor U1 that the ground is connected and is safe to proceed with the next step.

The Diagnostic Analyzer also protects itself from turning on into a short circuit or excessive load. It also detects most improper loads such as a transformer which is not compatible with the use of the Diagnostic Analyzer. When one of the three operating modes is selected, AC line voltage is applied to the output terminals 72 and 74 through a high value series current limiting resistor 180 (R5). The limiting resistor 180 and the load impedance connected to the output terminals form a voltage divider. If the impedance of the connected load is lower than the impedance of a compatible transformer circuit, the voltage at the output terminals 72 and 74 will be lower than a predetermined threshold and the Diagnostic Analyzer will interpret this as a shorted output. If the output terminal voltage is normal the Diagnostic Analyzer will proceed with the selected function. This protects the Diagnostic Analyzer from damage in most cases.

To facilitate this function, the output voltage detect circuit 182 incorporates a comparator in integrated circuit U7 for comparing the output voltage across output terminals 72 and 74 to a threshold generated from the 5 Volt bias supply using a resistive divider formed by resistors R33 and R28 and R29. If the Diagnostic Analyzer determines that the input connections have been properly made, and one of the three operating modes have been selected by the operator, the Diagnostic Analyzer will test the output terminals for a short circuit. Microprocessor U1 will produce a logic low output to optotriac U5, causing current to flow from the 5 Volt bias supply through resistor R21, through the optodiode in optotriac U5, and into microprocessor U1. This turns on the triac in optotriac U5 allowing current flow from the line input terminal 170, through circuit breaker 176, through resistor 180 (R5), through the triac in optotriac U5 to the line output terminal 72. Current will then flow out to the line output terminal 72 through the connected load to the neutral terminal 74. The voltage appearing across the load and thus the line output terminal 72 relative to the neutral terminal 74 is dependent on the impedance of the load relative to the limiting resistor 180. The voltage across the output terminals is sampled and divided by resistors R25, R24, and R32, and applied to the noninverting input of an op amp 182 a in voltage detect circuit 182, which is incorporated in integrated circuit U7. A reference level is developed by resistors R33, R28 and R29, and applied to the inverting input of the op-amp 182a in voltage detect circuit 182. If the load has an impedance lower than expected the signal at the output of the op-amp 182a in voltage detect circuit 182 will never exceed the reference level at the inverting input to the op-amp 182a. The voltage at the op-amp 182a output will remain at a logic low level, as will the corresponding input to microprocessor U1. Microprocessor U1 interprets this logic low as a shorted output terminals or improper load and sends an error pulse train to microcontrollers U2 and U8 which activate the appropriate visual and audible error messages.

If the impedance across the output terminals is sufficiently high it will develop a voltage on at the noninverting input that exceeds the reference level at the inverting input, and the output of op-amp 182a will switch to a high state for several milliseconds each cycle of the line. Microprocessor U1 senses this signal, interprets it as a correct load and proceeds with the chosen functional mode.

The line switching circuit 178 also includes feature to reduce internal power dissipation in the Diagnostic Analyzer. The large output current passing through the triac TR1 results in the power dissipation of nearly 20 Watts. Dissipating this much power safely and reliably would require a much larger case than desired. However, it is necessary to switch power with a triac to achieve the precise on and off times required to generate the pulses to activate the various modes available in the above-described transformer circuit. The switching circuit 178 accordingly includes a relay for bypassing the triac TR1 when power is to be applied for extended periods of time, allowing the unit to remain cool, yet fitting in one hand.

When the triac TR1 is to remain on for more than a few seconds, microprocessor U1 generates a high signal to resistor R22. This causes current to flow from microprocessor U1 through resistor R22 into ground. The logic high output from microprocessor U1 is also connected to the gate of transistor Q4 which turns on, allowing current to flow from the 12 Volt DC bias through relay K1, through transistor Q4 drain to source. This causes the contacts of relay K1 to close, providing an alternate, lower impedance path for line current to flow from line input terminal 170 to line output terminal 72, circumventing triac TR1. Nearly all of the current flows through the contacts of relay K1, which dissipates approximately 1 watt, rather than the 20 watts that would be dissipated by triac TR1. When power is to be removed from the transformer under test, the microprocessor output goes to a low state, turning off transistor Q4, causing relay K1 to open, and then the triac TR1 is turned off. This results in well controlled switching times due to the triac, as well as low power dissipation due to the relay.

The current detection circuit 188 is used to determine if the line current drawn by the neon transformer under test is greater than the small current drawn by a properly functioning transformer circuit. It provides a high current or low current signal to the microprocessor U1. Microprocessor U1 evaluates this information and determines if the current should be high or low during a given time interval. This information helps the microprocessor make a diagnosis of system problems.

Within the current detection circuit 188, resistor R31 connects to the neutral output terminal 74. Line current drawn by the unit under test must return to the Diagnostic Analyzer neutral output terminal 74 and flow through resistor R31 to return to the AC power mains via the Diagnostic Analyzer's neutral input terminal 172. Note that diodes D13 and D14 are in parallel with resistor R31. The resistance of R31 is chosen such that a current of approximately 0.15 amperes provides several tenths of volt drop that can be detected as a high current. However, a fully loaded transformer can draw as much as 10.0 amperes, which would result in excessive dissipation and destruction of resistor R31. Diodes D13 and D14 are Schottky type that conduct when the voltage across resistor R31 reaches a peak voltage of about 0.4 Volts, so that excess current is diverted from resistor R31, limiting the power dissipation to a safe level. Resistor R30 samples the voltage across resistor R31 and applies this voltage to the noninverting input of the op-amp 188a in current detect circuit 188 (which is incorporated into integrated circuit U7). Resistors R33, R28, and R29 form a voltage divider that provides a reference voltage to the inverting input of the op-amp 188a in current detect circuit 188. When current flow in the neutral terminal 74 passing through resistor R31 is sufficient that the peak voltage across resistor R31 and the noninverting input of the op-amp 188a reach the threshold voltage of the inverting input of the op-amp 188a, then the output of the op-amp 188a switches from a low to a high state. When the current drops below this level later in the line cycle the voltage of the op-amp 188a output drops to a low state. This will be repeated once each cycle of the 60 Hz line so long as the current remains sufficient. If the current is not sufficient to cause the op-amp 188a output to switch high, then the current is considered to be the normal current drawn by the transformer circuit with no current contribution by the neon transformer. The output of the op-amp 188a in the current detect circuit 188 is connected to the microprocessor U1. The microprocessor compares the status of this signal with the expected status for a given time interval and, with other inputs, determines if any system problems are apparent.

Diagnostic Analyzer controls the transformer circuit described above, to activate any one of the three modes of operation to assist service personnel to trouble shoot a sign installation. These are accessed by pressing the appropriate button or buttons on the front panel. These modes are Bypass, Diagnostic, and Operational.

Figure 15:
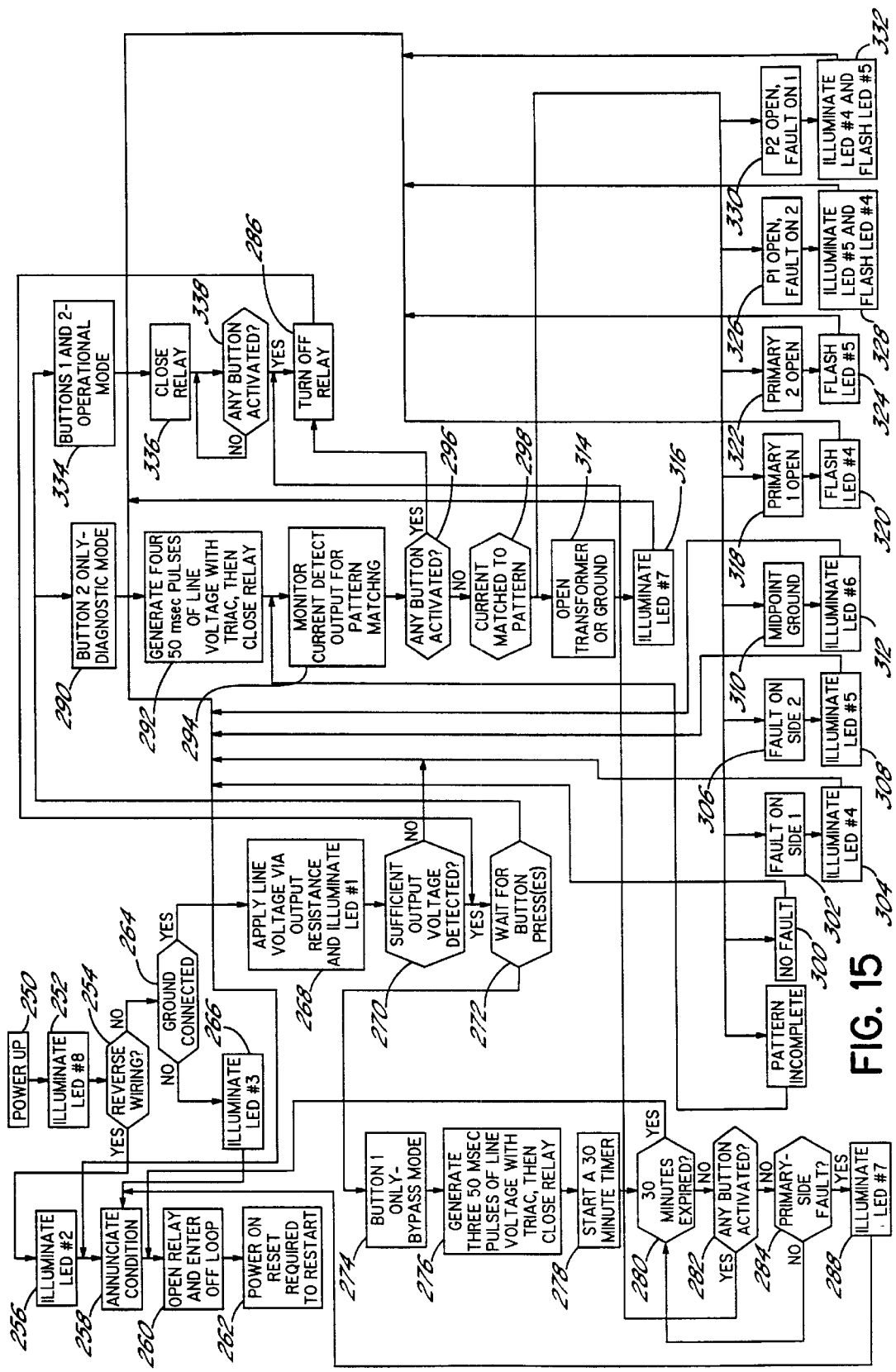
FIG. 15 is a flow chart of operations performed by the microprocessor in the diagnostic analyzer circuitry of FIG. 14.

Referring now to FIG. 15, the activities of the Diagnostic Analyzer in controlling the transformer circuit and diagnosing faults can be explained. When power is initially applied to the Diagnostic analyzer (step 250), microprocessor U1 causes microcontroller U2 to illuminate LED #8 to confirm that power is on (step 252).

Next, in step 254, microprocessor U1 analyzes the output of reversed line detect circuit 188 to determine whether there has been reverse wiring. If so, in step 256, microprocessor U1 instructs microcontroller U2 to illuminate LED #2 to indicate reverse wiring. Next, microprocessor U1 proceeds to step 258 and instructs microcontroller U8 to annunciate a reverse wiring condition. Thereafter, in step 260, microprocessor U1 instructs the triac and relay to open, disconnecting power from the transformer circuit, and enters an unending loop, thus latching the microprocessor U1 in an "off" state. From this "off" state, power must be removed and reapplied to restart the Diagnostic Analyzer (step 262).

If in step 254, no reverse wiring is detected, in step 264, microprocessor U1 processes the output from ground detect circuit 186 to determine whether a proper ground connection has been made. If not, microprocessor U1 proceeds to step 266 and instructs microcontroller U2 to illuminate LED #3, indicating a bad ground or reverse line connection to the Diagnostic Analyzer. After step 266, microprocessor U1 proceeds to step 258, and instructs microcontroller U8 to annunciate a bad ground or reverse line connection to the Diagnostic Analyzer, after which microprocessor U1 proceeds to a latched "off" condition in step 260.

If in step 264 proper wiring to the Diagnostic Analyzer is detected, microprocessor U1 proceeds to step 268, and applies the line voltage to the line output terminal 72 via resistance 180, by activating optotriac U5 as described above. At the same time, LED #1 is illuminated to indicate that power is applied to the transformer circuit. Then, in step 270, microprocessor U1 interrogates the output of voltage detect circuit 182 to determine whether a sufficient output voltage has been detected. If not, microprocessor U1 proceeds to step 258 to annunciate the appropriate warning of a miswired or incompatible transformer circuit, and then proceeds to step 260 to latch into an "off" state.

If a sufficient voltage is detected, then microprocessor U1 proceeds to step 272, in which it waits for one or more of the control buttons 192 to be pressed to trigger appropriate activity.

The bypass mode 274 is activated by pressing button #1 of the control buttons 192 on the front panel of the Diagnostic Analyzer. If button #1 is pressed, the Diagnostic Analyzer proceeds to step 276 and generates the power line sequence that activates the bypass mode in the neon transformer circuit. The sequence generated is an on-off-on-off-on-off sequence with each condition lasting 50 milliseconds followed immediately by the line remaining on.

Referring again momentarily to FIG. 14, when switch #1 on the Diagnostic Analyzer is pressed, microprocessor U1 generates a sequence of pulses to optotriac U4. When the microprocessor output goes low for approximately 50 milliseconds, current flows from the +5 Volt bias supply through resistor R19, through the diode in optotriac U4 into the microprocessor U1. This turns on the triac in optotriac U4, allowing current to flow from the input line terminal 170 through circuit breaker 176, through the triac in optotriac U4, through resistor R6 into the gate of triac TR1. This turns on triac TR1 allowing current flow from the Line input terminal through circuit breaker 176, through triac TR1 to the line output terminal 72, to the neon transformer under test. When the microprocessor output U1 goes to a logic high state for approximately 50 milliseconds, current flow to the diode in optotriac U4 is interrupted, turning off the triac in optotriac U4 which turns off triac TR1, turning off current flow to the neon transformer under test. In step 276 of FIG. 15, this on/off cycle is repeated two additional times, then power is turned on by closing relay K1 as described above. This sequence is sensed by the neon transformer circuit under test which turns on with the secondary ground fault detection disabled (assuming the line and ground connections to the neon transformer are correct). Thus the sign installation can be observed with power applied to aid service personnel trouble shooting faulty installations.

After step 276, a thirty minute timer is initialized in step 278, and then microprocessor U1 enters a loop comprising steps 280, 282 and 284. In step 280, microprocessor U1 determines whether the thirty minute timer has expired. If so, microprocessor U1 proceeds to step 260 to latch into the "off" state. If not, in step 282 microprocessor U1 determines whether any of the control panel buttons have been activated. If so, microprocessor U1 proceeds to step 286 at which it turns off the relay and then the triac in switching circuit 178, and then returns to step 272 to wait for further button presses. If in step 282 no button is pressed, microprocessor U1 proceeds from step 282 to step 284 at which it determines whether there has been a primary-side fault in the transformer circuit under test (e.g., reverse wiring or a missing connection). In the case of a primary-side fault, the transformer circuit under test will cease drawing power from the lines. Microprocessor U1 detects this condition by the absence of current flow indicated by current detect circuit 188. In such a condition, microprocessor U1 proceeds to step 288 in which it instructs microcontroller U2 to illuminate LED #3 to indicate a transformer circuit primary-side fault, and then proceeds to step 258 to instruct microcontroller U8 to annunciate a similar warning, and then proceeds to step 260 to latch in the "off" state. In the absence of a primary-side fault, microprocessor U1 will return to step 280 to remain in the thirty minute timer loop.

The Diagnostic mode of the Diagnostic Analyzer invokes the diagnostic mode of the attached neon transformer, evaluates the operation of the transformer circuit during diagnostic tests, and provides visual and voice indication of any problem detected. Diagnostic mode is invoked by pressing control button #2 only (step 290). When only control button #2 is pressed, in step 292 microprocessor U1 controls optotriac U4 and triac TR1 in the manner discussed above, to produce an on-off-on-off-on-off-on-off sequence, with each on and off period being 50 milliseconds in duration, after which relay K1 is closed to continuously supply power to the transformer circuit.

After activating the diagnostic mode of the transformer circuit, in step 294 microprocessor U1 monitors the output of the current detect circuit 188 for patterns of current flow indicative of various conditions of the transformer circuit under test. (If while monitoring the current flow pattern, any control button is activated, microprocessor U1 proceeds through step 296 to step 286, to turn off the relay and triac, and then return to step 272.) After a time window, the current flow pattern is pattern matched in step 298 to pre-stored patterns, to diagnose the status of the transformer circuit and connection.

Figure 16:
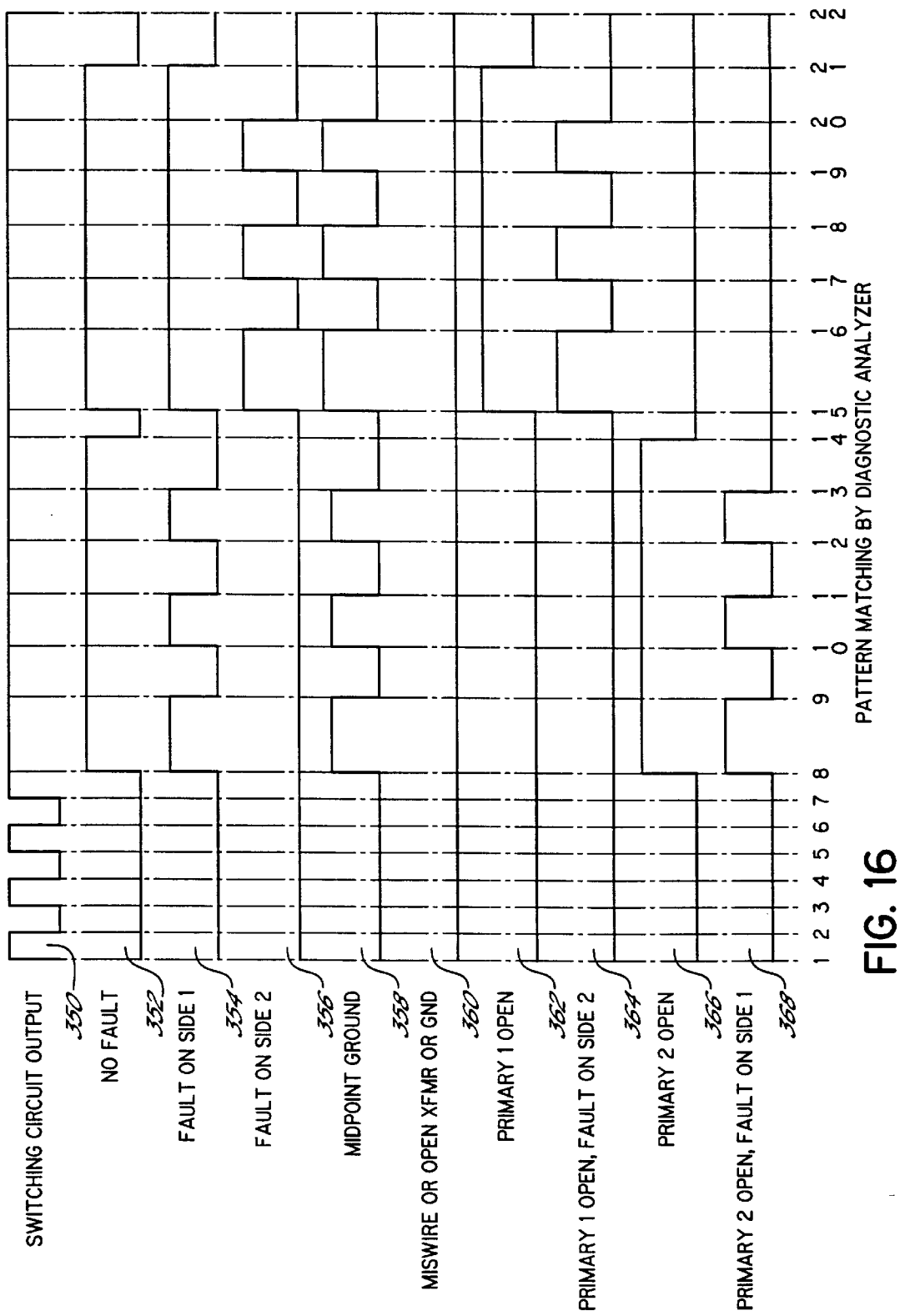
FIG. 16 is a timing diagram of signals detected by the diagnostic analyzer of FIGS. 13 and 14.

The various current flow patterns that might appear are illustrated in FIG. 16. Trace 350 in FIG. 16 shows the switching pulses which initiate the diagnostic mode.

Trace 352 in FIG. 16 shows the corresponding current flow pattern if there is no wiring or ground fault problem. In this case, current will be drawn continuously when secondary #1 is energized (step 152, FIG. 12), and then after a brief pause, current will be drawn continuously when secondary #2 is energized (step 160, FIG. 12). In the no fault condition (step 300, FIG. 15), microprocessor U1 will proceed to step 258 to produce a voiced message indicating that no problem was detected.

Trace 354 in FIG. 16 shows the current flow pattern that will occur if there is a fault in secondary #1. In this situation, an intermittent current flow will be detected when secondary #1 is energized, indicating a fault condition (step 154, FIG. 12). Then a continuous current flow will be drawn when secondary #2 is energized. Microprocessor U1, detecting this on/off sequence of current, will recognize a fault on side 1 (step 302), and illuminate LED #4 (step 304) and then proceed to step 258 in which the appropriate voice message will be delivered to indicate a fault was detected on secondary #1.

Trace 356 in FIG. 16 shows the current flow pattern that will occur if there is a fault in secondary #2. In this situation, continuous current flow will be detected when secondary #1 is energized, but an intermittent current flow will be detected when secondary #2 is energized (step 162, FIG. 12). Microprocessor U1, detecting this on/off sequence of current, will recognize a fault on side 2 (step 306), and illuminate LED #5, and then proceed to step 258 in which the appropriate voice message will be delivered to indicate a fault was detected on secondary #2.

Trace 358 illustrates the resulting current waveform if, during the diagnostic period, a fault is discovered on both output #1 and output #2. This pattern has intermittent waveforms when both secondaries are activated. This can mean that the midpoint return terminal on the neon transformer circuit is grounded, or the midpoint of the tubing load is connected to ground. A third, but less likely possibility is that a separate ground fault exists on both secondary #1 and secondary #2. In this situation, microprocessor U1 will detect a "midpoint ground" condition (step 310), illuminate LED #6 (step 312, and then proceed to step 258 to generate a voice message reporting all three possible fault conditions.

Trace 360 illustrates the waveform pattern if there is reverse wiring of the transformer circuit, or an open ground connection, or a defective or incompatible transformer circuit. In this condition, no current of significant amplitude will be drawn during any portion the diagnostic process. In this situation (step 314), microprocessor U1 illuminates LED #7 (step 316), and then proceeds to step 258 where a voice message announces the possible causes.

Trace 362 illustrates the waveform pattern that will be generated if primary 1 connections are not made properly. In this situation, no line current will be drawn during the time period when secondary #1 is energized. In this situation (step 318), microprocessor U1 causes LED #4 to flash (step 320), and then proceeds to step 258 to generate a voice message identifying the open primary 1 condition.

Trace 364 illustrates the waveform pattern that will be generated if secondary 1 has a ground fault and primary 2 connections are not made properly. In this situation, no current will be drawn during the time period when secondary #1 is energized, and an intermittent current will be drawn during the time period when secondary #2 is energized. In this situation (step 330), microprocessor U1 causes LED #4 to illuminate and causes LED #5 to flash (step 332), and then proceeds to step 258 to cause a voiced announcement of the corresponding condition.

Trace 366 illustrates the waveform pattern that will be generated if primary 2 connections are not made properly. In this situation, no line current will be drawn during the time period when secondary #2 is energized. In this situation (step 322), microprocessor U1 causes LED #5 to flash (step 324), and then proceeds to step 258 to generate a voice message identifying the open primary 2 condition.

Trace 368 illustrates the waveform pattern that will be generated if secondary 1 has a ground fault and primary 2 connections are not made properly. In this situation, an intermittent current will be drawn during the time period when secondary #1 is energized, and no current will be drawn during the time period when secondary #2 is energized. In this situation (step 326), microprocessor U1 causes LED #5 to illuminate and causes LED #4 to flash (step 328), and then proceeds to step 258 to cause a voiced announcement of the corresponding condition.

The operational mode of the Diagnostic Analyzer allows the neon transformer circuit to operate as if the Diagnostic Analyzer was not connected. This function is useful to verify correction of a problem without the need of removing the Diagnostic Analyzer from the installation. The input wiring must be properly connected to enable this function to operate, and the Diagnostic Analyzer output must not be shorted. This mode is activated by pressing buttons #1 and #2 simultaneously (step 334). In this mode, microprocessor U1 will close the relay in switching circuit 178, delivering power to the transformer circuit. Then, microprocessor U1 will sequence to step 338, where it will remain until any button is activated. When a button is activated, microprocessor U1 will proceed to step 286, turn off the relay in switching circuit 178, and then return to step 272 to wait for another button to be pressed.

The following table identifies component values for the various components of the circuit diagram of the transformer circuit of FIGS. 7–9 and 11, in accordance with one embodiment of the present invention:

| | |
|---|---|
| R1, 12, 16 | 10KΩ 1/4W CF 5% |
| R2, 11, 13, 19, 25, 26, 27, 31 | 24KΩ 1/4W CF 5% |
| R3, 17, 18, 24, 28, 29 | 47KΩ 1/4W CF 5% |
| R4, 30 | 100KΩ 1/4W CF 5% |
| R5 | 33KΩ 1/4W CF 5% |
| R6 | 931Ω 1/4W MF 1% |
| R7 | 7.50KΩ 1/4W MF 1% |
| R8 | 2.49KΩ 1/4W MF 1% |
| R9 | 3.3KΩ 1/4W CF 5% |
| R10, 22 | 1KΩ 1/4W CF 5% |
| R14 | 1.2KΩ 1W MO 5% |
| R15 | 22Ω 1/4W CF 5% |
| R20 | 4.32KΩ 1/4W MF 1% |
| R21 | 100Ω 1/4W CF 5% |
| R23, 32 | 470KΩ 1/4W CF 5% |
| R23, 32 (277) | 1MΩ 1/4W CF 5% (277V Only) |
| R30 | 220KΩ 1/4W CF 5% (277V Only) |
| R30 | 100KΩ 1/4W CF 5% |
| JP1, 2, 3, . . . 6 | Wire Jumpers |
| C1, 16 | 0.47 μF 250V UL RECOG × 10% |
| C1, C16 (277V) | .22 μF 300V UL RECOG × 20% |
| C2 | 47 μF 63V 105 C 8X11 |
| C3 | 0.1 μF 50V CMONO Axial |
| C4, 12 | 1 μF 50V 105 C +/−20% |
| C5, 6 | 0.0047 μF 250/400VAC ceramic Y cap 20% |
| C7, 9, 10 | 47 μF 25V 105 C 5X11 |
| C8 | 0.01 μF 50V CER MONO Axial |
| C13 | 0.1 μF 50V MPE |
| C14 | 0.033 μF 100V CER MONO X7R |

-continued

| | |
|---|---|
| C15 | 390 pF 100V CMONO COG Axial 5% |
| C17 | 1000 pF 100V CMONO X7R Axial 20% |
| D1 | 1N4004 |
| D2–14, 17 | 1N4148 |
| Z1 | P6KE51A 5IV TRANSORB 600W |
| Z2 | 130V 1/2W 1N5274B |
| Z3, 8 | 5.6V 1/2W 1N5232B |
| Z4, 9 | 9.1V 1/2W 5% 1N5239B |
| Z5, 6 | 20V 1W 1N4747A |
| Z7 | 3.3V 1/2W 5% 1N5226B |
| Q1, Q3, Q4 | MPSAO6 60V TO-92 |
| Q2 | BS107 |
| Q5, 7, 9 | PN2222A |
| Q6 | MPS2907A |
| Q8 | MPSA56 80V TO-92 |
| U1 | 4N25A OPTO COUPLER |
| U2 | TL431 ADJ. REFERENCE 85C |
| U3 | IC PIC16C56-RCI/P Microcontroller, MICROCHIP |
| K1, K2 | 48VDC 12A@120V 7A@277 SEALED |
| PCB1 | PC Board (3.4" × 3.5") Single-sided, solder mask, silk screen |

The following table identifies component values for the various components of the circuit diagram of the Diagnostic Analyzer of FIG. 14, in accordance with one embodiment of the present invention:

| | |
|---|---|
| R1,10,27 | 24KΩ 1/4W 5% |
| R2,11,22,35 | 33KΩ 1/4W 5% |
| R3 | 10KΩ 1/4W 5% |
| R4,13 | 1KΩ 1/4W 5% |
| R5 | 20KΩ 3W 5% |
| R6 | 1.5KΩ 1/2W 5% |
| R7 | NOT USED |
| R8,9 | 470KΩ 1/4W 5% |
| R12,15,16, | 47KΩ 1/4W 5% |
| R14 | 100KΩ 1/4W 5% |
| R17,18,19,21 | 470Ω 1/4W 5% |
| R20,26 | 4.32KΩ 1/4W 1% |
| R23 | 1MΩ 1/4W 5% |
| R24,25 | 200KΩ 1/4W 1% |
| R28 | 8.87KΩ 1/4W 1% |
| R29,30 | 1.00KΩ 1/4W 1% |
| R31 | 2.2Ω 1W 5% |
| R32 | 150KΩ 1/4W 1% |
| R33 | 6.34KΩ 1/4W 1% |
| R34 | 10Ω 1/4W 5% |
| RS1 | 470Ω 9PIN SIP 2% |
| D1–4,8,9,10,12, | 1N4148 |
| D11 | NOT USED |
| D5–7 | 1N4007 |
| D13,14 | MBR2030CTL |
| LED1–9 | HLMP3316 |
| Z1,4,5 | P6KE12A |
| Z2,3 | 1N5232B |
| C1,5,20 | .47 μF 275V |
| C2 | 47 μF 25V |
| C3,7 | 4700 pF 400VAC Y CAP |
| C4,8,10 | 1 μF 50V |
| C6 | 470 μF 25V |
| C9 | 2200 pF 50V COG |
| C11,19 | 390 pF 50V COG |
| C12 | 6.8 μF 15V TAN |
| C13,14,18 | .01 μF 50V CER AX |
| C15,16.17 | 1 μF 275V |
| U1,2 | PIC 16C56 |
| U3 | 4N25A |
| U4,5 | MOC3023 |
| U6 | MC7805 |
| U7 | LM358 |
| Q1,2,3,5 | MPS2222A |
| Q4,5 | VN2222LL |
| TR1 | Q5008hbL4 |

-continued

| | |
|---|---|
| SW2,3 | SPDT MOMENTARY WITH LED E switch 5501M21 |
| K1 | 12A 120V, 12VCOIL |
| CB1 | 15A MAGNETIC |
| | 6 ft cable 14/3 Coleman SJEO |
| U8 | PIC 16C56 MICROPROCESSOR |
| U9 | IDS2590 VOICE MEMORY |
| U10 | LM386 AUDIO POWER AMPLIFIER |
| SW3 | SPDT MOMENTARY WITH LED SPEAKER, 8Ω |

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described.

For example, in several applications, a flashing circuit is placed between the applied AC power and the neon transformer, which intermittently applies power to the sign so that the sign will flash. This could be incompatible with the neon transformer circuitry described above, in that this circuitry requires a second or longer after power is applied to initialize, test various conditions, and illuminate the sign. If power is applied intermittently by a flashing circuit for only one to two second intervals, this could cause the sign to be illuminated for an undesirably short period, or not at all. Furthermore, in the existence of a ground fault, the continual restarting of the transformer circuit might cause significant ground fault current to flow, as the transformer circuitry would be reset each time the flashing circuit disconnected and reconnected power.

Figure 17:
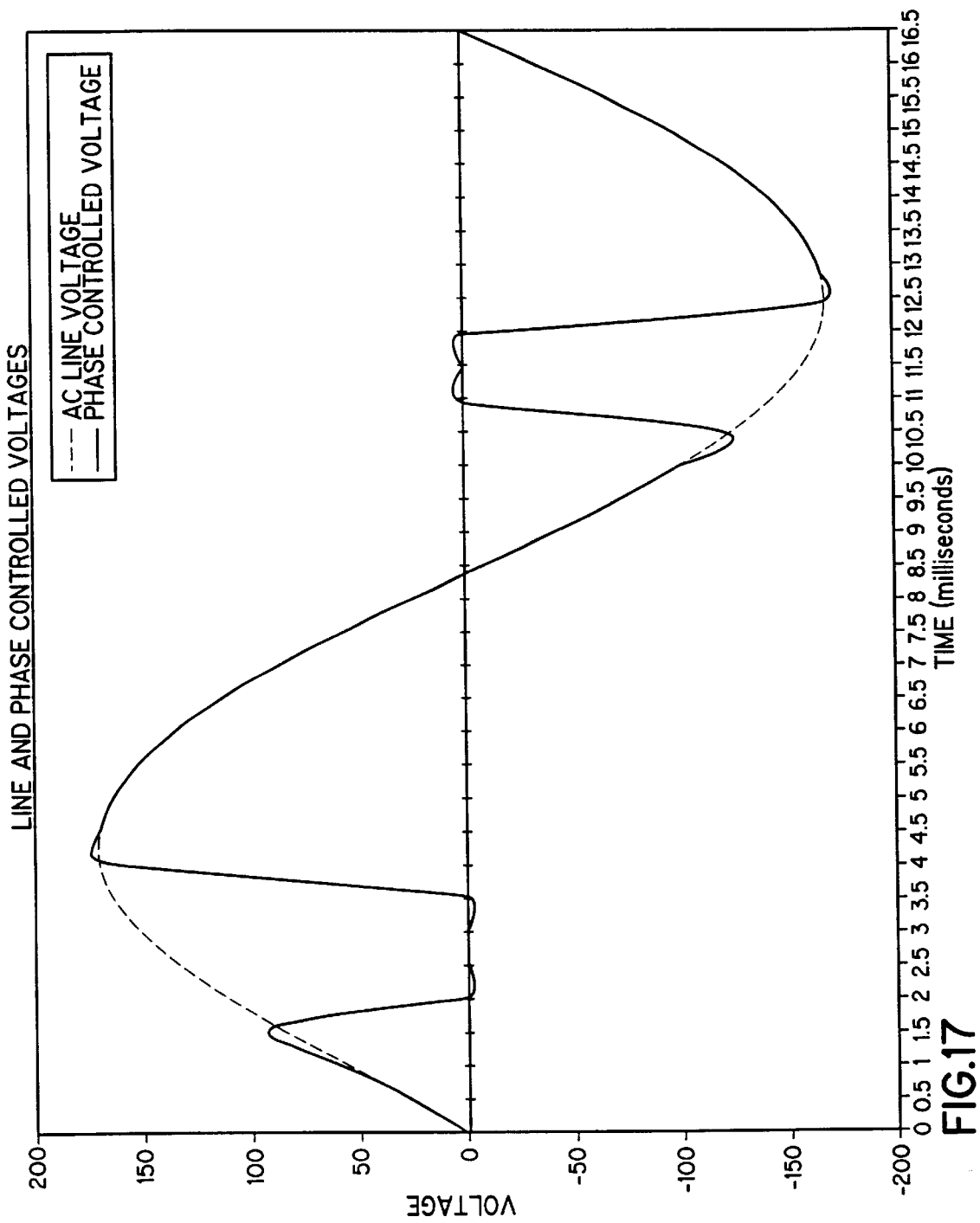
FIG. 17 is a diagram of the AC voltage produced by a dimmer circuit typically used with neon tubing.

Another incompatibility may be caused by dimming circuits that are used at times with neon transformers. One type of dimming circuit, inserted between the neon transformer and power lines, introduces a blanking interval into the AC line voltage, in order to reduce the volt-second product of the AC input signal and thus dim the light output from the tubing. The resulting power line waveform is shown in solid lines FIG. 17. The dotted lines show the normal sinusoidal line waveform that is received by the transformer circuit without dimming. Dimming of this kind might reduce the voltage available to the bias supplies in the transformer circuitry described above, causing erratic operation, and thus be incompatible with the use of the transformer circuitry described above. Furthermore, the discontinuous waveform produced by the dimmer might produce improper switch timing due to the line voltage passing through zero volts at times other than between the sinusoidal half-cycles.

Figure 18:
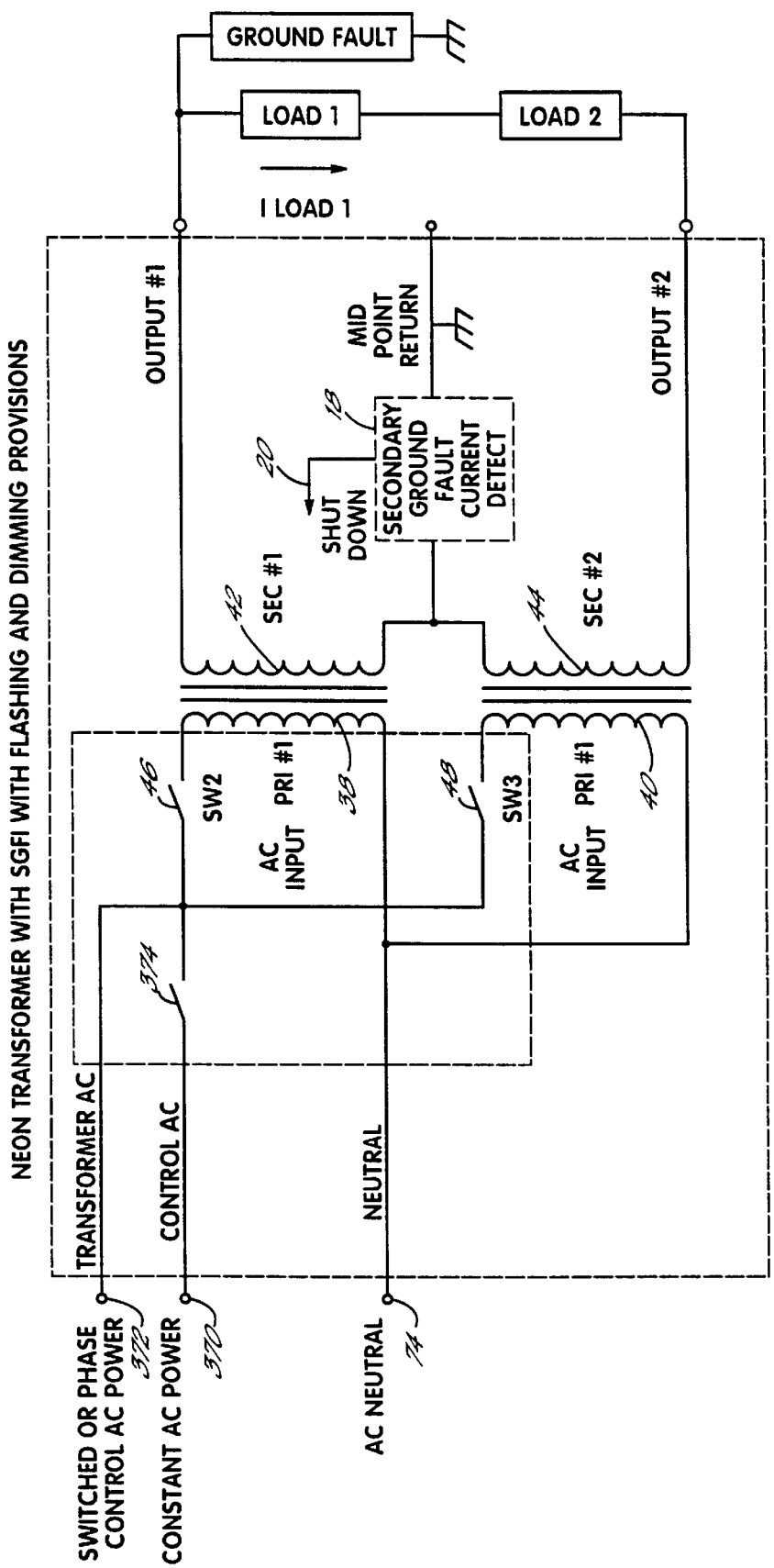
FIG. 18 is a diagram of primary control circuitry suitable for use with a dimmer circuit.

FIG. 18 illustrates a configuration of a neon transformer primary circuit adapted to avoid these incompatibilities. This circuit has, in place of the single line input terminal 72 shown in the preceding Figs., a separate constant AC line voltage terminal 370 and a switched or phase control dimmed line voltage terminal 372. An additional switch 374, which is normally open, is also provided. The primary control circuitry illustrated in FIG. 11 is powered from the constant AC line terminal 370, whereas the primary windings 38 and 40 are connected (via switches 46 and 48) to the switched or phase control dimmed line terminal 372. Thus, constant power is applied to the control circuitry whereas switched and/or phase control dimmed power is applied to the primary windings for driving the neon tubing, with no adverse affects on the primary control circuitry and without resetting the primary control circuitry with each flash of the tubing.

To prevent tampering by the user, additional features must be included. For example, the user might attempt to defeat the grounded mid-point load detecting features by providing power to constant input terminal 370 only, and not to terminal 372, for a brief period of time needed to initialize the operation of the sign. If there were no connection between terminal 370 and 372, the result would be that no power would be applied to the transformer, and no ground faults or load mid-point ground connections would be detected. Then, after initialization, power could be applied to terminals 372 and 370, permitting operation of the sign with a grounded mid-point.

To prevent such tampering, in one embodiment, switch 374 is included. The primary control circuitry controls switch 374 to short terminals 370 and 372 for about one second when power is initially applied, ensuring that the transformer is energized during startup and that a grounded tubing midpoint or other ground fault condition is detected during startup.

Another embodiment which does not require a relay or triac for switch 374, is for the primary control circuitry to monitor the voltage at terminal 372 and prevent the startup sequence from proceeding until the line voltage is present on terminal 372, ensuring that power will be provided to the primary windings and a ground fault will be detected.

In another alternative embodiment of the invention, the secondary ground fault detecting transformer circuit uses other methods for signaling a fault to the user and/or a Diagnostic Analyzer. For example, at the close of a diagnostic cycle initiated by a four pulse on/off sequence, as discussed above with reference to FIG. 12, the transformer circuit could turn on both sides of the transformer simultaneously for a set period of time, the duration of which is related to the nature of any fault detected during the diagnostic cycle. The microprocessor in the transformer control circuit will control the on time in relation to faults that have been detected. If no fault is detected, this could be signaled by not turning the transformer back on after the diagnostic cycle. The Diagnostic Analyzer could then sense whether current is drawn after the end of the diagnostic cycle, and the period of time during which current is drawn, and from these determine the appropriate error codes and take the appropriate action as discussed above with reference to FIG. 15. In this approach, it will be noted that some faults will prevent one or both sides of the transformer from being energized. These faults must be detected by the Diagnostic Analyzer as a missing current during a given interval as previously discussed with reference to FIG. 16. The faults that must be detected this way are a missing neon transformer ground wire, an open power connection to the neon transformer, or an open primary.

In another alternative embodiment, during the test mode of operation, both secondary windings can be energized in phase with each other, as opposed to out-of-phase as is done during normal operation. Doing so will prevent fault currents from one secondary from masking fault currents from the other secondary, and allow detection of a grounded mid-point load. This approach avoids the need to energize only one secondary without the opposite secondary. To implement this approach, additional switching must be included on the primary or secondary side of the transformer to permit the second primary to be energized in opposite phase when in test mode, or permit reversal of the wiring of the secondary during test mode. In either case, the equivalent of a double-pole, double-throw switch must be incorporated into the transformer circuit to permit phase reversal during the test mode.

Accordingly, departures may be made from such details without departing from the spirit or scope of applicant's general inventive concept.

What is claimed is:

1. A diagnostic analyzer for connection to an electrical power supply and diagnosing the presence of a fault, the power supply including power input terminals and power output terminals for connection to a load, fault detection circuits, and a power application circuit controlling application of power to the power output terminals in response to the fault detection circuits, the diagnostic analyzer comprising power input terminals for connection to a source of electrical power, power output terminals connectable to the power input terminals of the power supply, a power flow circuit monitoring power flow from the power output terminals of the diagnostic analyzer to the power input terminals of the power supply, and a diagnosis circuit connected to the power flow circuit, the diagnosis circuit generating a command signal for delivery to said power supply via said power output terminals of said diagnostic analyzer, and evaluating the power flow monitored by the power flow circuit to identify power flow patterns indicative of a fault, the diagnosis circuit signaling the presence of a fault upon recognition of a power flow pattern indicative of a fault.

2. The diagnostic analyzer of claim 1 wherein the diagnostic analyzer circuit generates a visual indication in response to recognition of a power flow pattern indicative of a fault.

3. The diagnostic analyzer of claim 2 wherein the diagnostic analyzer comprises a light emitting diode and the diagnosis circuit generates the visual indication of a fault by illuminating the light emitting diode.

4. The diagnostic analyzer of claim 1 wherein the diagnostic analyzer comprises an audible signal generator and the power application circuit signals the presence of a fault by causing the audible signal generator to generate an audible signal.

5. The diagnostic analyzer of claim 4 wherein the audible signal generator is a voice synthesizer and the diagnostic circuit signals the presence of a fault by causing the voice synthesizer to annunciate the presence of the fault in a synthesized human voice.

6. The diagnostic analyzer of claim 1 adapted for use with a power supply with a power application circuit having a test mode activated by applying a command signal to the input power terminals of the power supply, wherein an input and an output power terminal of the diagnostic circuit are connected together via an electrical switch, wherein the diagnostic circuit delivers a control signal to the power supply by controlling the electrical switch to connect and disconnect electrical power to/from the power supply in accordance with a command signal pattern.

7. The diagnostic analyzer of claim 6 adapted for use with a power supply with a application circuit that draws electrical power through the power input terminals of the power supply in accordance with a pattern to signal a kind of fault, wherein the diagnosis circuit detects the pattern of electrical power drawn to determine a kind of fault and signals this kind of fault.

8. A method for diagnosing the presence of a fault in a power supply, the power supply including power input terminals and power output terminals for connection to a load for applying electrical power thereto, the method comprising connecting a source of electrical power to the power input terminals of the power supply, generating a command signal for delivery to said power supply via said power in terminals of said power supply, monitoring power flow to the power input terminals of the power supply, evaluating the power flow to the power input terminals of the power supply to identify power flow patterns indicative of a fault in the power supply, and signaling the presence of a fault in the power supply upon recognition of a power flow pattern indicative of a fault.

* * * * *

UNITED STATES PATENT AND TRADEMARK OFFICE
CERTIFICATE OF CORRECTION

| | | |
|---|---|---|
| PATENT NO. | : 6,366,208 B1 | |
| DATED | : April 2, 2002 | |
| INVENTOR(S) | : Hopkins et al. | |

It is certified that error appears in the above-identified patent and that said Letters Patent is hereby corrected as shown below:

<u>Title page,</u>
Insert Item -- [73] Assignee:     France/Scott Fetzer Company, West Fairview, Tenn. --.

<u>Column 1,</u>
Line 24, delete "connection transformer" and replace it with -- connection. A transformer --.
Line 63, delete "process. If difficulty" and replace it with -- process. Difficulty --.

<u>Column 2,</u>
Line 12, delete "reliably" after "fault".

<u>Column 4,</u>
Line 59, delete "audible signals" and replace it with -- audible signal --.

<u>Column 5,</u>
Line 63, delete "diagram a" and replace it with -- diagram of a --.

<u>Column 8,</u>
Line 6, delete "core is such" and replace it with -- core are such --.
Lines 23, 24 and 36, delete "circuit 52" and replace it with -- circuit 51 --.

<u>Column 12,</u>
Line 7, delete "micro processor" and replace it with -- microprocessor --.

<u>Column 13,</u>
Lines 16 and 18, delete "micro processor" and replace it with -- microprocessor --.
Line 26, delete "transformer and could" and replace it with -- transformer could --.
Line 46, insert a comma after "However".
Line 55, delete "capacitor CS" and replace it with -- capacitor C5 --.

<u>Column 16,</u>
Line 49, delete the second occurrence of "from the".

<u>Column 20,</u>
Line 31, delete "Diagnostic analyzer" and insert -- Diagnostic Analyzer --.

<u>Column 21,</u>
Line 14, delete "and forces produces" and replace it with -- and produces --.
Line 21, delete the first occurrence of "the".

UNITED STATES PATENT AND TRADEMARK OFFICE
CERTIFICATE OF CORRECTION

PATENT NO. : 6,366,208 B1
DATED : April 2, 2002
INVENTOR(S) : Hopkins et al.

It is certified that error appears in the above-identified patent and that said Letters Patent is hereby corrected as shown below:

Column 22,
Line 15, delete "modes have been" and replace it with -- modes has been --.
Line 31, delete "amp 182 a" and replace it with -- amp 182a --.
Line 47, delete "voltage on at the" and replace it with -- voltage at the --.
Line 53, delete "includes features" and replace it with -- includes a feature --.

Column 24,
Line 8, delete "Diagnostic analyzer" and insert -- Diagnostic Analyzer --.

Column 26,
Line 41, delete "(step 312, and" and replace it with -- (step 312), and --.

Column 27,
Line 66, delete "MONO Axial" and replace it with -- MONO Axial --.

Column 28,
Line 68, delete "Q5008hbL4" and replace it with -- Q5008L4 --.

Column 31,
Line 6, delete "of applicant's" and replace it with -- of applicants' --.

Column 32,
Line 33, delete "power in terminals" and replace it with -- power input terminals --.

Signed and Sealed this

Eleventh Day of April, 2006

JON W. DUDAS
*Director of the United States Patent and Trademark Office*